(12) United States Patent
Zeng et al.

(10) Patent No.: US 9,089,037 B2
(45) Date of Patent: Jul. 21, 2015

(54) LONG DECAY PHOSPHORS FOR LIGHTING APPLICATIONS

(71) Applicant: Intematix Corporation, Fremont, CA (US)

(72) Inventors: Qinghua Zeng, Fremont, CA (US); Gang Wang, Milpitas, CA (US); Yi-Qun Li, Danville, CA (US)

(73) Assignee: Intematix Corporation, Fremont, CA (US)

(*) Notice: Subject to any disclaimer, the term of this patent is extended or adjusted under 35 U.S.C. 154(b) by 321 days.

(21) Appl. No.: 13/749,494

(22) Filed: Jan. 24, 2013

(65) Prior Publication Data

US 2013/0187556 A1    Jul. 25, 2013

Related U.S. Application Data

(60) Provisional application No. 61/590,801, filed on Jan. 25, 2012.

(51) Int. Cl.
| | |
|---|---|
| *H05B 33/08* | (2006.01) |
| *H05B 33/12* | (2006.01) |
| *C09K 11/77* | (2006.01) |
| *H01L 33/50* | (2010.01) |
| *F21Y 101/02* | (2006.01) |
| *F21V 3/04* | (2006.01) |

(52) U.S. Cl.
CPC ............ *H05B 33/12* (2013.01); *C09K 11/7721* (2013.01); *H05B 33/08* (2013.01); *F21V 3/0481* (2013.01); *F21Y 2101/02* (2013.01); *H01L 33/502* (2013.01)

(58) Field of Classification Search
USPC ................ 315/192; 313/501–504; 257/88–89
See application file for complete search history.

(56) References Cited

U.S. PATENT DOCUMENTS

| | | | |
|---|---|---|---|
| 5,998,925 A | 12/1999 | Shimizu et al. | |
| 6,294,800 B1 | 9/2001 | Duggal et al. | |
| 6,945,672 B2 | 9/2005 | Du et al. | |
| 7,138,660 B2* | 11/2006 | Ota et al. | 257/79 |
| 7,157,746 B2* | 1/2007 | Ota et al. | 257/100 |

(Continued)

OTHER PUBLICATIONS

Liu, Yongfu, et al., "Luminescence and energy transfer in $Ca_3Sc_2Si_3O_{12}:Ce^{3+},Mn^{2+}$ white LED phosphors," Journal of Luminescence. Dec. 24, 2011 (e-publication). vol. 133, pp. 21-24.

(Continued)

*Primary Examiner* — An Luu
(74) *Attorney, Agent, or Firm* — David H. Jaffer; Pillsbury Winthrop Shaw Pittman LLP

(57) ABSTRACT

A photoluminescent material has the characteristic of a long photoluminescence decay and has the general composition $Ca_{3-x-m-n}A_xSc_{2-y}M_ySi_{3-z}E_zO_{12}:mCe^{3+},nMn^{2+}$, where A is at least one divalent cation including Sr, Ba or a combination of monovalent and trivalent cations including combinations of Li, Na, K, B, Al and Ga; M is at least one trivalent cation including Al, Ga, or a divalent cation including Mg, E is a combination of a trivalent and a pentavalent cation including B, Al, Ga, N and P, or a combination of monovalent and trivalent cations including Li, Na, K, B, Al, Ga, N and P. The A cation replaces Ca; the M cation replaces Sc, and E replaces Si. This Mn and Ce doped phosphor emits in the yellow to green with a peak at around 510 and/or 560 and 690 nm. The phosphor material has applications in LED illumination systems.

20 Claims, 20 Drawing Sheets

(56) References Cited

U.S. PATENT DOCUMENTS

| | | | |
|---|---|---|---|
| 7,213,942 B2 | 5/2007 | Jiang et al. | |
| 7,309,151 B2 | 12/2007 | Mok et al. | |
| 7,679,101 B2 * | 3/2010 | Ota et al. | 257/100 |
| 7,740,514 B2 | 6/2010 | Setlur et al. | |
| 7,786,659 B2 * | 8/2010 | Oaku et al. | 313/486 |
| 8,188,687 B2 * | 5/2012 | Lee et al. | 315/323 |
| 8,324,840 B2 | 12/2012 | Shteynberg et al. | |
| 8,497,621 B2 | 7/2013 | Kraus | |
| 8,807,799 B2 * | 8/2014 | Li et al. | 362/299 |
| 2002/0146835 A1 | 10/2002 | Modzelewski et al. | |
| 2004/0159846 A1 | 8/2004 | Doxsee et al. | |
| 2010/0219428 A1 | 9/2010 | Jung et al. | |
| 2010/0295458 A1 | 11/2010 | Cheng et al. | |
| 2012/0229038 A1 | 9/2012 | Zeng et al. | |

OTHER PUBLICATIONS

International Search Report and Written Opinion for PCT/US2013/022688 Issued May 15, 2013.

\* cited by examiner

LONG DECAY PHOSPHORS FOR LIGHTING APPLICATIONS

CROSS-REFERENCE TO RELATED APPLICATIONS

This application claims the benefit of U.S. Provisional Application No. 61/590,801 filed Jan. 25, 2012, incorporated by reference in its entirety herein.

FIELD OF THE INVENTION

Embodiments of the present invention relate to phosphor compositions emitting green to yellow light, wherein the emitted light has a millisecond decay time; moreover embodiments of the invention relate to AC operable white light emitting devices and lighting systems utilizing such phosphors.

BACKGROUND OF THE INVENTION

Wavelength conversion methods that use excitation light produced by solid-state light source such as laser diodes (LDs) or light emitting diodes (LEDs) and photoluminescent wavelength conversion materials such as phosphors or quantum dots can produce high brightness light at wavelengths different from the wavelength of the excitation light. In conventional devices, excitation light impinges on a wavelength conversion material, which absorbs the excitation light and emits light at a wavelength higher than the wavelength of the excitation light.

It is now common to implement white light sources, such as solid-state white light sources, using photoluminescent wavelength conversion materials. An LED diode that is operable to generate excitation light in the UV or blue region is used in conjunction with the excitation light source to generate, for example, white light. As taught in U.S. Pat. No. 5,998,925, white LED lighting systems include one or more photoluminescent materials (e.g., phosphor materials), which absorb a portion of the radiation emitted by the LED and re-emit radiation of a different color (wavelength). Typically, the LED chip or die generates blue light and the phosphor(s) absorbs a percentage of the blue light and re-emit(s) yellow light or a combination of green and red light, green and yellow light, green and orange light, or yellow and red light. The portion of the blue light generated by the LED that is not absorbed by the phosphor combined with the light emitted by the phosphor provides light which appears to the human eye as being nearly white.

When operating using a direct current (DC) drive, a relatively continuous current level is maintained to drive the excitation light source (e.g., the LED). Therefore, for DC-based lighting applications, the photoluminescent materials used in the wavelength conversion components are preferred to have a decay time of less than a millisecond so that the light can be turned on and off immediately when the electrical switch is turned on and off, respectively.

However, it is possible that an alternating current (AC) source may be used to drive the LED lighting system. With AC power supplies, the electrical current forms a wave pattern that "alternates" to different current levels, e.g., usually a sine wave. An LED that is operable with AC currents is called an AC LED. A rectifier can be used to provide a double frequency of the input current to drive the AC LED.

The rectifier can be implemented as a simple rectified circuit without a capacitor or other more complex IC designs so as to avoid using electrolytic smoothing capacitors that have a lifetime much less than the expected lifetime of the LED. For other AC LEDs, the LEDs themselves, which are diodes, can be configured as a self-rectifying configuration—for example strings of serially connected LEDs which are connected in parallel with opposite polarities. Another example would be to provide the LEDs within the arms of a bridge rectifier configuration. In self-rectifying configurations one fraction of the LEDs will be operable on positive cycles of the drive current whilst another fraction will be operable on negative cycles of the drive current. As a result, in AC LEDs that use self-rectifying configurations the LEDs, and hence light output, will be modulated at the drive current frequency and the light output may appear to flicker. Moreover, whilst simple drivers without a capacitor have the advantage of lower cost and longer life time, such AC lighting systems will also have their light output modulated at the frequency of the input AC current, which will result in flickering.

Therefore, there is a need for a better approach for implementation of AC-based lighting that maintains the advantages of using cost-effective rectifier circuits, without unwanted AC-related artifacts such as flickering.

SUMMARY OF THE INVENTION

An improved photoluminescent material is provided in some embodiments which has the characteristic of a long photoluminescence time decay. In some embodiments the long decay phosphor is based on a cerium doped calcium scandium silicate phosphor of general composition $Ca_3Sc_2Si_3O_{12}$:Ce that is co-doped with $Mn^{2+}$ to increase the phosphor decay time. An example of such a long decay phosphor material comprises $Ca_{3-x-m-n}A_xSc_{2-y}M_ySi_{3-z}E_zO_{12}$:$mCe^{3+}$,$nMn^{2+}$, where A is at least one divalent cation including Sr, Ba or a combination of monovalent and trivalent cations including combinations of Li, Na, K, B, Al and Ga; M is at least one trivalent cation including Al, Ga, or a divalent cation including Mg; E is a combination of a trivalent and a pentavalent cation including B, Al, Ga, N and P, or a combination of monovalent and trivalent cations including Li, Na, K, B, Al, Ga, N and P, and wherein $x+m+n \leq 3$, $y<2$ and $z<3$. The formula is written to indicate that the cation A replaces Ca, the cation M replaces Sc, and E replaces Si. This Mn and Ce doped phosphor emits in the yellow part of the spectrum with a peak in emission at around 510 and/or 560 and 690 nm. Some examples of formulas of photoluminescent materials of the present invention include: $Ca_{2.74}Sc_2Si_3O_{12}Ce_{0.06}Mn_{0.2}$; $Ca_{2.74}Sc_{1.94}Mg_{0.06}Si_3O_{12}Ce_{0.06}Mn_{0.2}$; $Ca_{2.74}Sc_{1.94}Mg_{0.06}Si_{2.97}Al_{0.03}O_{12}Ce_{0.06}Mn_{0.2}$; $Ca_{2.69}Sr_{0.05}Sc_2Si_3O_{12}Ce_{0.06}Mn_{0.2}$; $Ca_{2.64}Sr_{0.10}Sc_2Si_3O_{12}Ce_{0.06}Mn_{0.2}$; $Ca_{2.59}Sr_{0.15}Sc_2Si_3O_{12}Ce_{0.06}Mn_{0.2}$; $Ca_{2.54}Sr_{0.20}Sc_2Si_3O_{12}Ce_{0.06}Mn_{0.2}$; $Ca_{2.69}Ba_{0.05}Sc_2Si_3O_{12}Ce_{0.06}Mn_{0.2}$; $Ca_{2.74}Sc_{1.94}Mg_{0.06}Si_{2.94}Al_{0.06}O_{12}Ce_{0.06}Mn_{0.2}$; $Ca_{2.74}Sc_{1.90}Mg_{0.10}Si_{2.94}Al_{0.06}O_{12}Ce_{0.06}Mn_{0.2}$; $Ca_{2.74}Sc_{1.85}Mg_{0.15}Si_{2.94}Al_{0.06}O_{12}Ce_{0.06}Mn_{0.2}$; $Ca_{2.74}Sc_{1.75}Mg_{0.25}Si_{2.94}Al_{0.06}O_{12}Ce_{0.06}Mn_{0.2}$; $Ca_{2.69}Sr_{0.05}Sc_{1.95}Mg_{0.05}Si_{2.94}Al_{0.06}O_{12}Ce_{0.06}Mn_{0.2}$; $Ca_{2.69}Sr_{0.05}Sc_{1.90}Mg_{0.10}Si_{2.94}Al_{0.06}O_{12}Ce_{0.06}Mn_{0.2}$; $Ca_{2.69}Sr_{0.05}Sc_{1.85}Mg_{0.15}Si_{2.94}Al_{0.06}O_{12}Ce_{0.06}Mn_{0.2}$; and $Ca_{2.69}Sr_{0.05}Sc_{1.80}Mg_{0.20}Si_{2.94}Al_{0.06}O_{12}Ce_{0.06}Mn_{0.2}$. These phosphors generally have photoluminescence decay times in milliseconds and enable low cost, long lifetime AC LED illumination systems. (Herein, decay time is the time taken for the photoluminescence intensity to drop to 50% after excitation stops.)

The inventive phosphor material shows efficient emission under both UV and blue LED excitation light. The luminous energy from $Ce^{3+}$ can be efficiently transferred to $Mn^{2+}$ ions in the exemplary material, where the $Mn^{2+}$ dopant is the long decay luminous ion and the material shows efficient luminescence under excitation by UV to blue LEDs. The luminescence of $Mn^{2+}$ ions in some embodiments of the present invention show millisecond decay times, and therefore the emission from $Mn^{2+}$ ions in the material will continue after the AC current is off. This allows the light emission gap between the current OFF and ON to be filled by this long decay light. In addition, the emission of the $Mn^{2+}$ ions in this inventive material shows good reliability and high quenching temperature. The phosphor material of the present invention can be used with many types of LED for lighting applications. According to some embodiments of the present invention an AC operable solid-state light emitting device comprises: at least one solid-state excitation source operable to generate excitation light and a photoluminescent material operable to absorb at least a fraction of the excitation light and to emit light of a different wavelength wherein the photoluminescent material has a decay time greater than one millisecond. For a 50/60 Hz AC drivable device, the photoluminescent material can have a photoluminescence decay time of at least three milliseconds. Furthermore, the photoluminescent material may have a decay time that is configured to reduce flickering in the output of the device. Yet furthermore, the photoluminescent material may have a decay time that is configured to produce light during periods of the AC cycle when the excitation source is not generating excitation light.

According to embodiments of the present invention, a white light lighting system may comprise: a plurality of LEDs configured to be directly operable from an AC power supply and which generate blue excitation light; and a photoluminescent material configured to absorb at least a part of the excitation light and in response emit yellow and/or green light, the photoluminescent material being a Ce and Mn doped silicate phosphor; wherein the photoluminescent material has a decay time of at least 1 ms. Furthermore, the plurality of LEDs may be configured as at least two strings of serially connected LEDs, wherein the strings are connected in parallel and with an opposite polarity. Yet furthermore, the photoluminescent material may be provided remotely to the plurality of LEDs or on a light emitting surface of at least one of the plurality of LEDs.

According to further embodiments of the present invention, a white light lighting system may comprise: a plurality of LEDs configured to be directly operable from an AC power supply having a drive cycle and which generate blue excitation light; and a phosphor including a photoluminescent material configured to absorb at least a part of the excitation light and in response emit yellow and/or green light, the photoluminescent material being a Ce and Mn doped silicate phosphor; wherein the modulation depth of light emitted by the phosphor over a single drive cycle is less than about 75%. Furthermore, the phosphor may be selected such that the modulation depth of light emitted by the phosphor over a single drive cycle is less than about 50%. Yet furthermore, the phosphor may be selected such that the modulation depth of light emitted by the phosphor over a single drive cycle is less than about 25%.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE INVENTION

Figure 1:
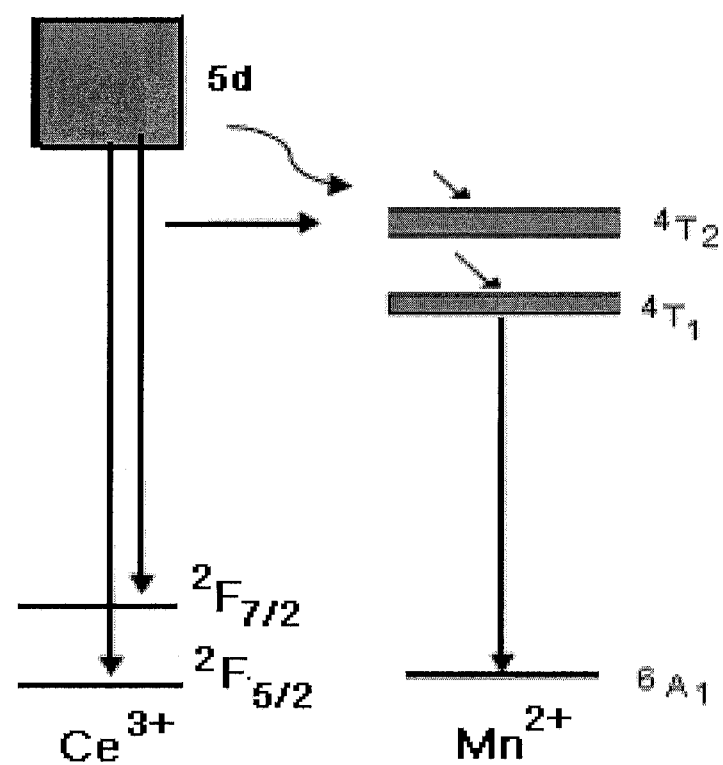
FIG. 1 shows the energy transfer mechanism between $Ce^{2+}$ and $Mn^{2+}$ that may operate in some embodiments of the present invention.

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Some embodiments of the present invention are directed to a long decay photoluminescent materials and light emitting devices that include such long decay materials. Such long decay photoluminescent materials absorb excitation light from an excitation light source to generate photoluminescence. Unlike conventional photoluminescent materials, the long decay photoluminescent material does not immediately stop its emission of photoluminescence when it stops receiving excitation light from the excitation light source. Instead, when the excitation light stops, the long decay photoluminescent material continues to emit light in a "long decay" pattern that diminishes over a longer period of time, on the order of milliseconds.

There are many advantages to using long decay photoluminescent materials for AC-based lighting devices. For example, consider the AC lighting system that uses a cost-effective rectifier implemented without a smoothing capacitor or other complicated IC design, e.g., that avoids usage of an electrolytic capacitor. A conventional AC LED lighting system without the capacitor and using a conventional photoluminescent material will have its light output modulated at the frequency of the input AC current, which will result in flickering of the light output. According to embodiments of the present invention, usage of the long decay photoluminescent material will smooth out the light output from such AC lighting systems, even without a smoothing capacitor, which eliminates and/or significantly reduces flickering. In some embodiments the long decay photoluminescent material can be considered to provide optical smoothing of the light output in an analogous manner to a capacitor providing electrical smoothing of an AC signal. This allows the AC-lighting system to maintain the advantage of using a simple driver without a capacitor to have a lower cost and a longer life time, while also avoiding unwanted AC-related artifacts such as flickering.

One embodiment of the invention is to use long decay phosphors on phosphors pumped by an AC driven LED or LED array. When a single LED or LED array is directly pumped by an AC driver, the LED die emits light constantly. The AC voltage applied to the LED (or array of LEDs) has to exceed a threshold value to make the LED emit light. As a result, the LED turns on and off at the same frequency, or a double the frequency, when the AC driving power sweeps between zero, and its peak value. This causes the LED to flicker. As a typical AC line power has a frequency of 50 or 60 Hz, the LED will flicker at a frequency of 50 to 60 Hz, or double that frequency, 100/120 Hz. The presence of flickering can significantly influence the perceived quality of a light source to a human observer. Light flickering at 100/120 Hz is not normally perceived by a human, but there are concerns nonetheless.

In addition to flickering at a given frequency, there is another condition known as "modulation depth" which also affects the quality of the light originating from a flickering light source. Modulation depth is defined as the ratio of deviation to the maximum light output of a light source within an AC duty cycle. Smaller modulation depths indicate that output of a light source is more uniform over time. The human eye finds it more difficult to sense the flicker from a small modulation depth light source than a maximum modulation source that is 100 percent on and off during a duty cycle. For example, in an embodiment of the present invention a white light lighting system comprises: a plurality of LEDs configured to be directly operable from an AC power supply having a drive cycle and which generate blue excitation light; and at least one photoluminescent material configured to absorb at least a part of the excitation light and in response emit yellow and/or green light; wherein the modulation depth (drop in intensity) of light emitted by the photoluminescence material over a single drive cycle is less than about 75%, that is over a single drive cycle the minimum intensity of light emitted by the photoluminescence material is at least 25% of the maximum intensity. Preferably the photoluminescence material is selected such that the modulation depth of light emitted by the photoluminescence material over a single drive cycle is less than about 50% and more preferably less than about 25%.

When a long decay phosphor is used, the LED light source continues to emit light during the "off" period. For a 50 to 120 Hz flickering frequency, the LED off period is normally about 1 ms to about 10 ms. A long decay phosphor can effectively fill the gap and reduce the modulation depth of a light source.

In another embodiment of the present invention, a long decay phosphor (also known as a millisecond decay phosphor) is applied to a simplified DC driver that lacks a capacitor to control the ripple voltage. This kind of driver may be as simple as a rectifier. This kind of driver has the advantage of being simple and low cost, while at the same time demonstrating a long lifetime and high efficiency, and as such, it is commonly used in LED lighting. Similarly, a long decay phosphor can improve the modulation depth of the DC driver pump LED light output when the ripple voltage is high in the driver design. With embodiments of the invention, usage of the long decay photoluminescent material will smooth out the light output from such AC lighting systems, even without a smoothing capacitor, which eliminates and/or significantly reduces flickering. In some embodiments the long decay photoluminescent material can be considered to provide optical smoothing of the light output in an analogous manner to which a capacitor provides electrical smoothing. This allows the AC-lighting system to maintain the advantage of using a simple driver without a capacitor to have a lower cost and a longer life time, while also getting avoiding unwanted AC-related artifacts such as flickering.

In another embodiment of the present invention, a long decay phosphor (e.g., millisecond decay phosphor) is used in conjunction with a dimmable LED source using pulse width modulation (PWM). Most LED dimmers use pulse width modulation to dim an LED's output, and 120 Hz is a commonly used as the dimming frequency. The use of a long decay phosphor in this device can make the pulse width modulation dimming more like DC dimming, which in turn reduces the flickering caused by the pulse width modulated signal.

In some embodiments of the invention, the long decay photoluminescent material is manufactured by doping a conventional photoluminescent material with an appropriate dopant to form a compound having a structure to create the desired long decay effects. For example, in exemplary embodiments of the present invention the luminous energy from $Ce^{3+}$ can be efficiently transferred to $Mn^{2+}$ ions, where the $Mn^{2+}$ dopant is the long decay luminous ion and the material shows efficient luminescence under excitation by UV to blue LEDs.

The luminescence of $Mn^{2+}$ consists of broad d-d emission band which is ascribed to the forbidden transition from the excited state $^4T_1$ to the ground state $^6A_1$. The emission color of $Mn^{2+}$ activated compounds varies from green to red with the changes in the matrix, the coordination number of $Mn^{2+}$ and the strength of the ligand field. Due to it being a forbidden transition, the decay time from $^4T_1$ to $^6A_1$ is in the millisecond range. However, in general the $Mn^{2+}$ activated compounds show weak absorption in the UV-Blue region, consequently a sensitizer is used herein to improve absorption in this part of the spectrum. The emission of $Mn^{2+}$ can be greatly enhanced by the host matrix or by the addition of ions such as $Eu^{2+}$, $Pr^{2+}$ and $Ce^{3+}$, etc.

As an example, FIG. 1 shows the energy transfer between $Ce^{3+}$ and $Mn^{2+}$, as in some embodiments of the present invention. The $Ce^{3+}$ has a $4f^1$ configuration and its excited configuration is a $4f^0 5d^1$ state. The 4f electron of the ground $4f^1$ configuration forms $^2F_{7/2}$ and $^2F_{5/2}$ states by spin-orbit coupling. In compound according to some embodiments of the present invention, after absorbing the excitation energy from 450 nm LED chips, the $Ce^{3+}$ in the compound shows emissions at around 510 nm corresponding to the transition from 5d to $^2F_{5/2}$ and another peak at 525 nm corresponding to the transition from 5d to $^2F_{7/2}$, which energy is then transferred to the $Mn^{2+}$ ions with emissions at around 560 nm and 690 nm.

Figure 2:
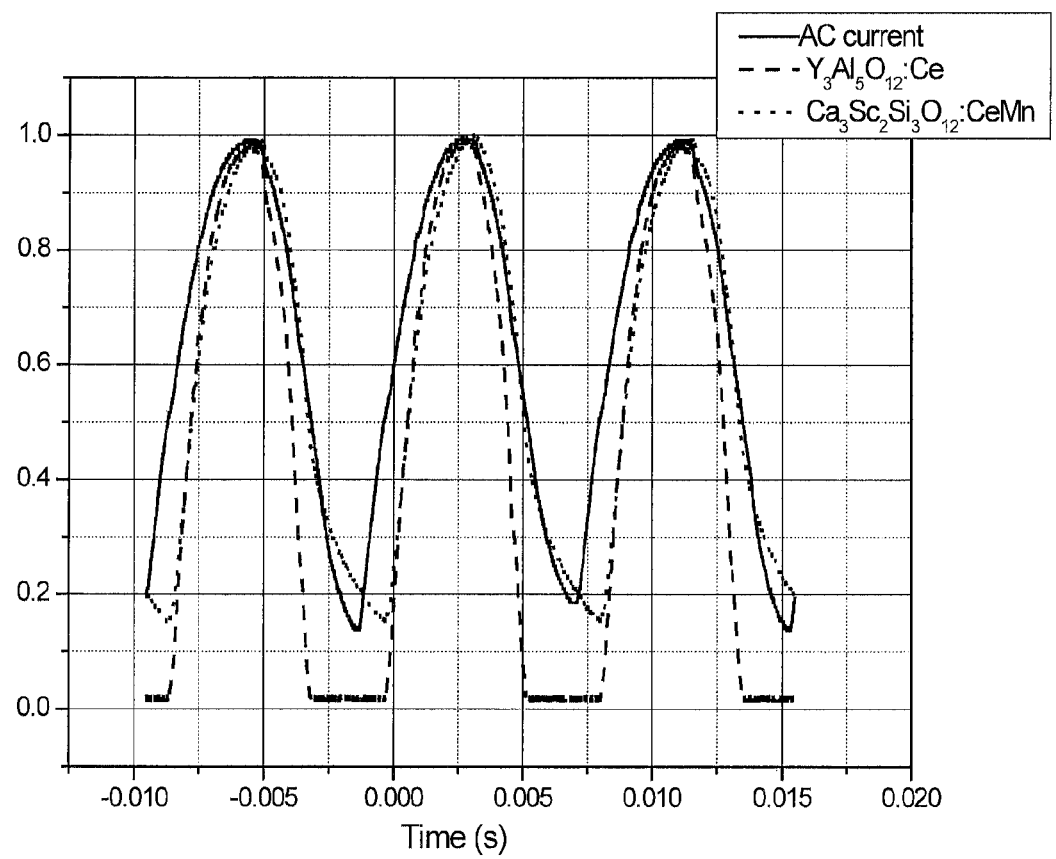
FIG. 2 shows the photoluminescence intensity curve of a $Ca_3Sc_2Si_3O_{12}$:$Ce^{3+}$, $Mn^{2+}$ phosphor of the present invention under a 450 nm, 120 Hz sinusoidal excitation, the intensity curve for $Y_3Al_5O_{12}$:Ce is shown for comparison.

An exemplary long decay phosphor according to some embodiments of the present invention is $Ca_3Sc_2Si_3O_{12}$:$Ce^{3+}$, $Mn^{2+}$ phosphor. FIG. 2 illustrates the long decay behavior of this material. The solid line in this figure shows the characteristics of the 120 Hz AC current driving the blue LED. The dotted line shows a photoluminescence intensity curve of the long decay $Ca_3Sc_2Si_3O_{12}$:$Ce^{3+}$,$Mn^{2+}$ phosphor, and the dashed line shows the characteristics of the regular (short photoluminescence decay time) YAG phosphor ($Y_3Al_5O_{12}$:Ce.), where both types of phosphors are excited by a 450 nm excitation light from the blue LED operated at 120 Hz AC with a sinusoidal wave shape.

One can immediately observe that the decay of the emission from the $Ca_3Sc_2Si_3O_{12}$:$Ce^{3+}$,$Mn^{2+}$ phosphor is much slower than from the $Y_3Al_5O_{12}$:Ce phosphor. In fact, the emission of the $Y_3Al_5O_{12}$:Ce phosphor abruptly ends at certain points in the AC current cycle. In contrast, the emission of the $Ca_3Sc_2Si_3O_{12}$:$Ce^{3+}$,$Mn^{2+}$ phosphor continues at significant levels over several additional milliseconds after the period in which the conventional YAG phosphor stops its emissions. In fact, it can be seen that even when the AC current is at its lowest point, some light is still being emitted from the $Ca_3Sc_2Si_3O_{12}$:$Ce^{3+}$,$Mn^{2+}$ phosphor.

Figure 3:
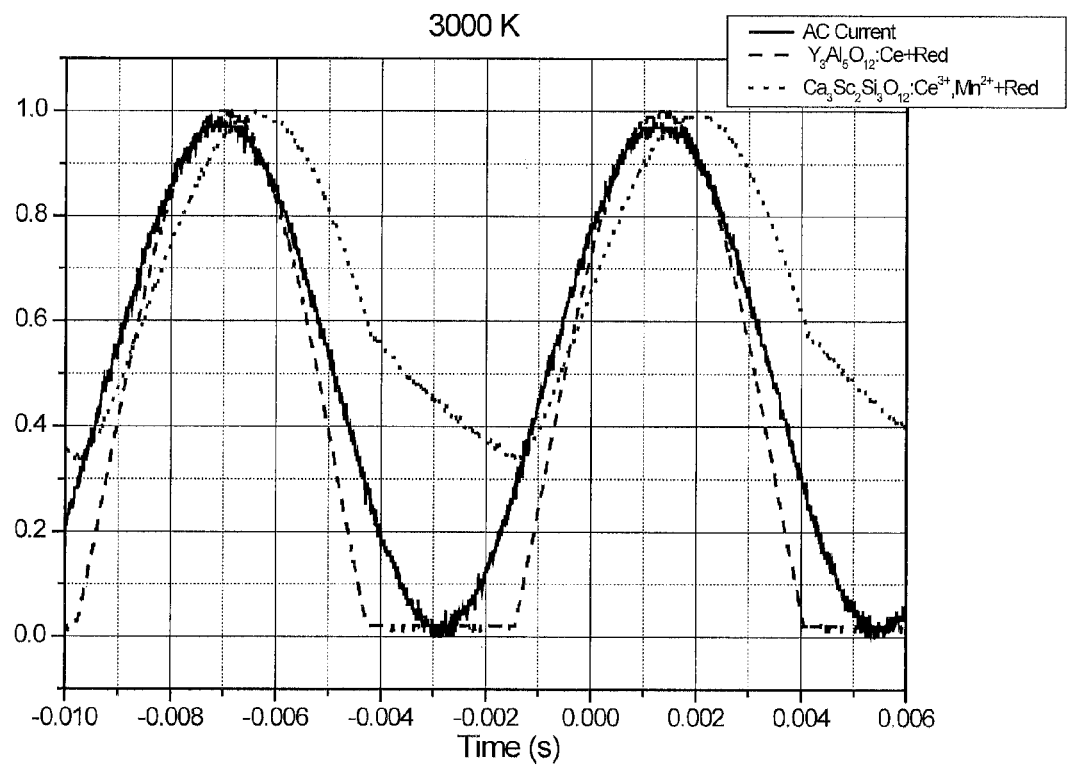
FIG. 3 shows the photoluminescence intensity curve of a $Ca_3Sc_2Si_3O_{12}$:$Ce^{3+}$, $Mn^{2+}$ phosphor of the present invention combined with a red phosphor at CCT=3000K under a 450 nm, 120 Hz sinusoidal excitation, the intensity curve for $Y_3Al_5O_{12}$:Ce combined with a red phosphor is shown for comparison.

To further improve the decay curve characteristics of the lighting devices, the green-emitting phosphor of the long-decay material according to the present invention can be used in conjunction with red phosphors, e.g., in white light applications. The dotted line in FIG. 3 illustrates a photoluminescence intensity curve of a long-decay $Ca_3Sc_2Si_3O_{12}$:$Ce^{3+}$, $Mn^{2+}$ phosphor material according to the present invention combined with a red phosphor at a correlated color temperature (CCT) of 3000 K, and the dashed line illustrates the intensity curve for the conventional $Y_3Al_5O_{12}$:Ce material in combination with a red phosphor, where both types of phosphors are excited by a 450 nm excitation light from a blue LED operated at 120 Hz AC with a sinusoidal wave shape. The AC current is represented by the solid line. One can observe that the emission from the $Ca_3Sc_2Si_3O_{12}$:$Ce^{3'}$,$Mn^{2+}$ phosphor combined with the red phosphor has a decay that is slower than the $Y_3Al_5O_{12}$:Ce phosphor in combination with the red phosphor.

Figure 4:
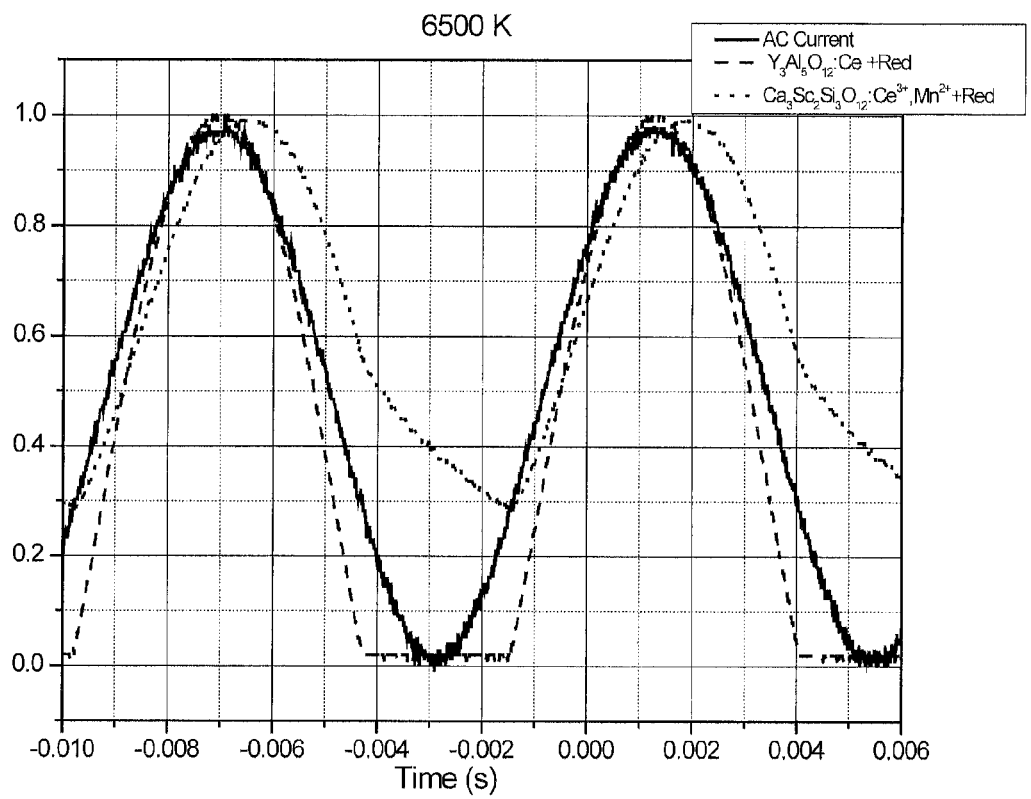
FIG. 4 shows the photoluminescence intensity curve of a $Ca_3Sc_2Si_3O_{12}$:$Ce^{3+}$, $Mn^{2+}$ phosphor of the present invention combined with a red phosphor at CCT=6500 K under a 450 nm, 120 Hz sinusoidal excitation, the intensity curve for $Y_3Al_5O_{12}$:Ce combined with a red phosphor is shown for comparison.

Similar results may be obtained for lighting applications at other temperature levels. The dotted line in FIG. 4 illustrates the photoluminescence intensity curve of a long-decay $Ca_3Sc_2Si_3O_{12}$:$Ce^{3+}$, $Mn^{2+}$ phosphor material according to the present invention combined with a red phosphor at a CCT of 6500 K, and the dashed line illustrates the intensity curve for the conventional $Y_3Al_5O_{12}$:Ce phosphor material in combination with a red phosphor, where both types of phosphors are excited by a 450 nm excitation light from a blue LED operated at 120 Hz AC with a sinusoidal wave shape. As before, the AC current is represented by the solid line. One can observe that the emission from the $Ca_3Sc_2Si_3O_{12}$:$Ce^{3+}$, $Mn^{2+}$ phosphor combined with the red phosphor has a decay that is slower than the $Y_3Al_5O_{12}$:Ce phosphor in combination with the red phosphor.

Figure 5:
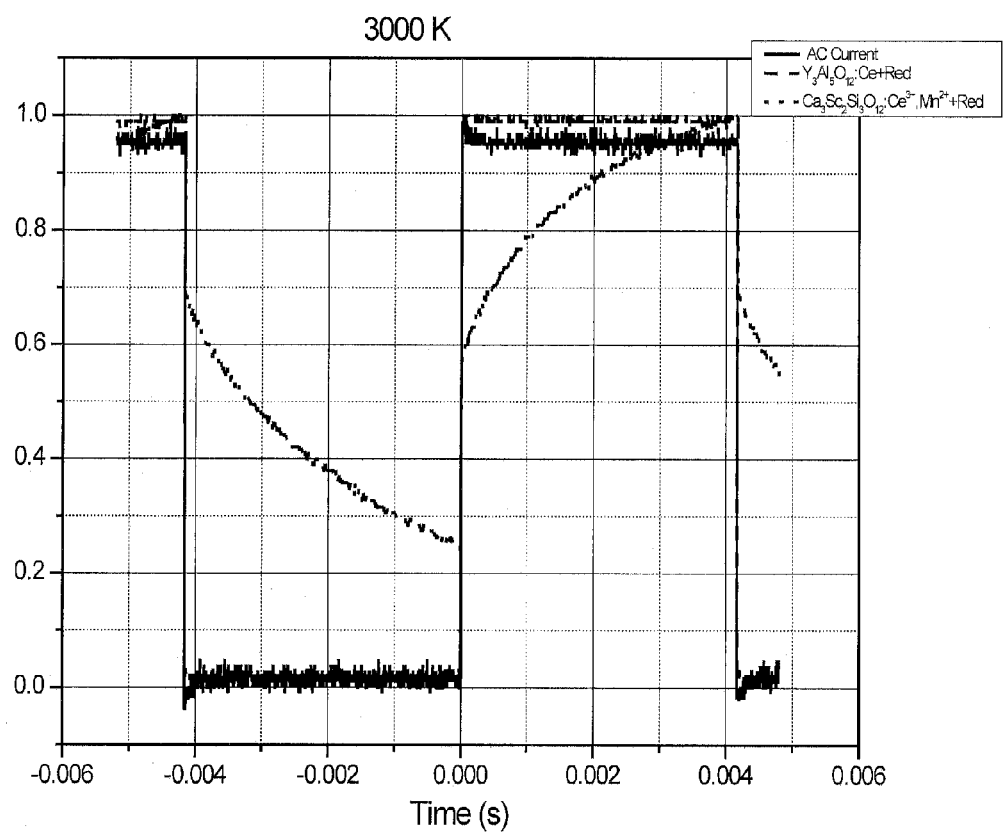
FIG. 5 shows the photoluminescence intensity curve of a $Ca_3Sc_2Si_3O_{12}$:$Ce^{3+}$, $Mn^{2+}$ phosphor of the present invention combined with red phosphor at CCT=3000K, under a 450 nm, 120 Hz square wave excitation, the intensity curve for $Y_3Al_5O_{12}$:Ce combined with a red phosphor is shown for comparison.

Similar results are achievable for AC currents having wave patterns that are not sine waves. For example, FIG. 5 illustrates the photoluminescence intensity curve of a $Ca_3Sc_2Si_3O_{12}$:$Ce^{3+}$, $Mn^{2+}$ phosphor material according to the present invention combined with a red phosphor at a CCT of 3000 K, and the dashed line illustrates the intensity curve for the conventional $Y_3Al_5O_{12}$:Ce phosphor material in combination with a red phosphor, where both types of phosphors are excited by a 450 nm excitation light from a blue LED operated at 120 Hz AC with a square wave shape. The square wave AC current is represented by the solid line. Here, the dashed line of the YAG material almost exactly coincides with the solid line of the AC current, which shows that when the AC current is off the YAG material very quickly stops emitting. This is in contrast to the much slower decay curve exhibited by the dotted line of the $Ca_3Sc_2Si_3O_{12}$:$Ce^{3+}$,$Mn^{2+}$ material.

Figure 6:
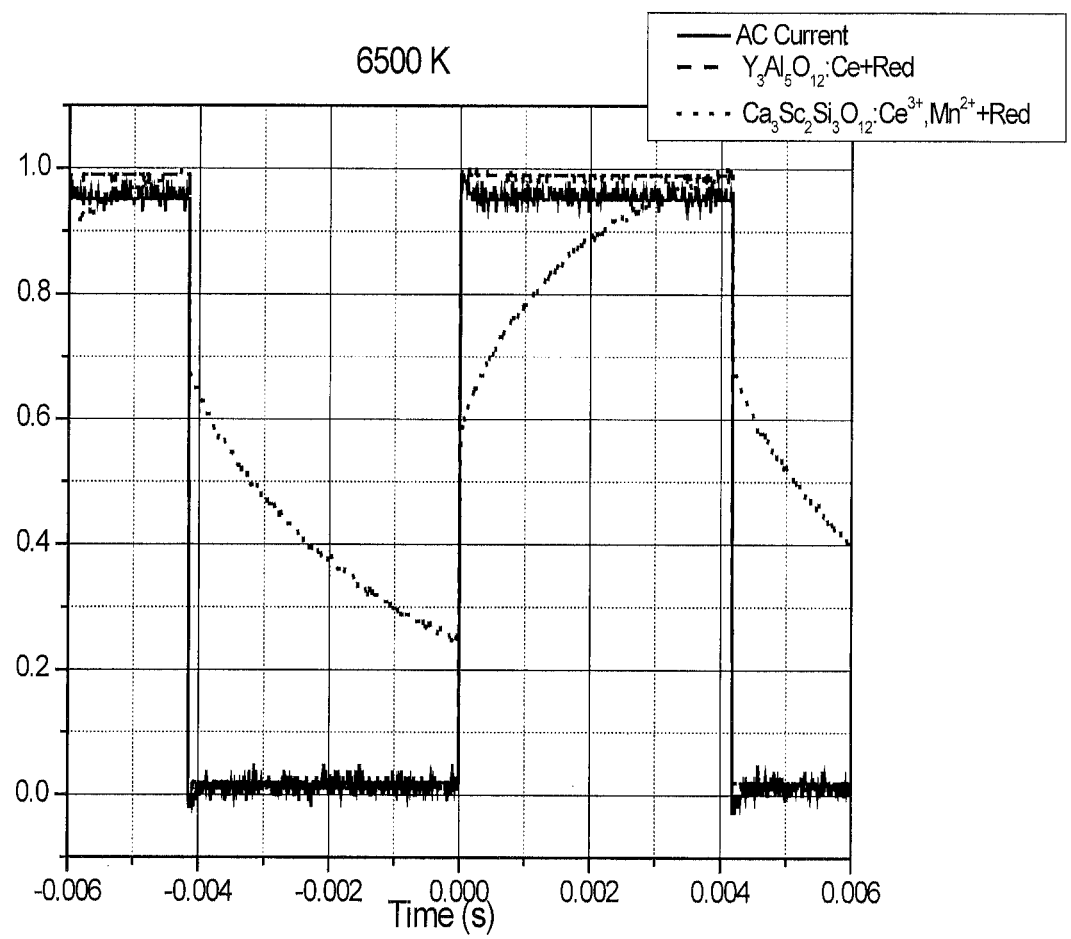
FIG. 6 shows the photoluminescence intensity curve of a $Ca_3Sc_2Si_3O_{12}$:$Ce^{3+}$, $Mn^{2+}$ phosphor of the present invention combined with red phosphor at CCT=6500K, under a 450 nm, 120 Hz square wave excitation, the intensity curve for $Y_3Al_5O_{12}$:Ce combined with a red phosphor is shown for comparison.

FIG. 6 illustrates the photoluminescence intensity curve of a $Ca_3Sc_2Si_3O_{12}$:$Ce^{3+}$, $Mn^2$ phosphor material according to the present invention combined with a red phosphor at a CCT of 6500 K, and the dashed line illustrates the intensity curve for the conventional $Y_3Al_5O_{12}$:Ce phosphor material in combination with a red phosphor, where both types of phosphors are excited by a 450 nm excitation light from a blue LED operated at 120 Hz AC with a square wave shape. The square wave AC current is represented by the solid line. As before, the emission of the $Ca_3Sc_2Si_3O_{12}$:$Ce^{3+}$, $Mn^{2+}$ phosphor combined with red phosphor has a decay that is slower than the conventional $Y_3Al_5O_{12}$:Ce material.

Figure 7:
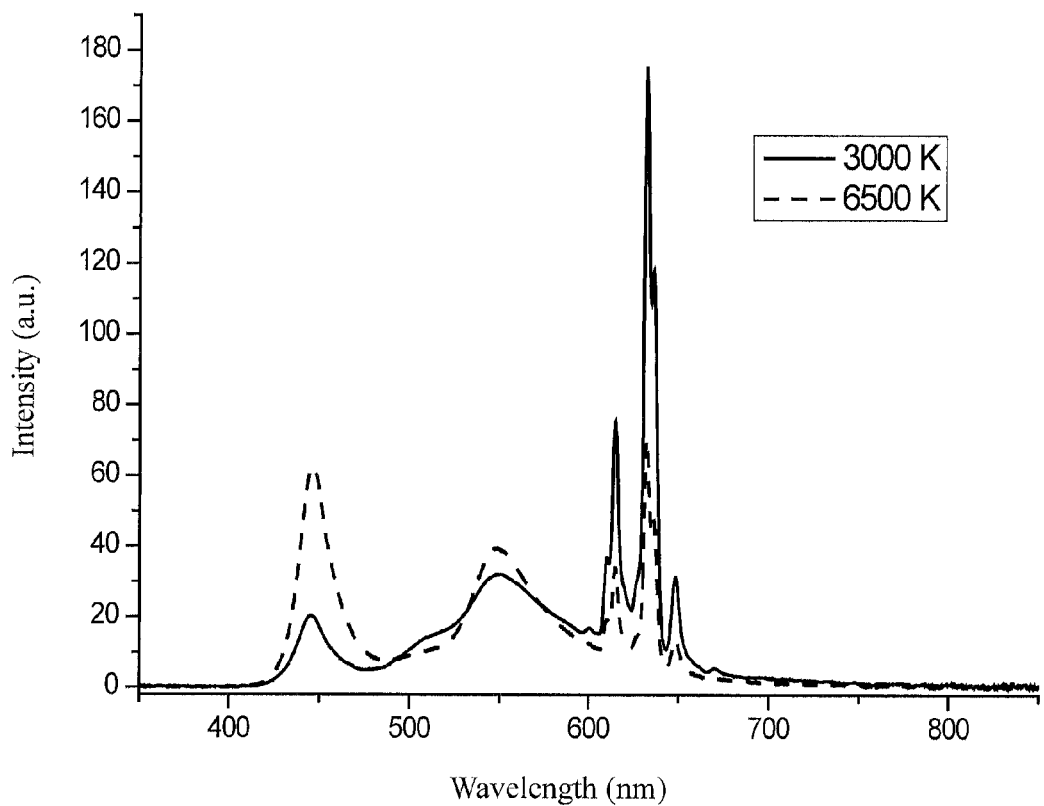
FIG. 7 shows the emission spectra of a $Ca_3Sc_2Si_3O_{12}$:$Ce^{3+}$, $Mn^{2+}$ phosphor of the present invention combined with red phosphor on an LED package at CCT=3000K and 6500K, under 450 nm excitation.

FIG. 7 illustrates the emission spectra of $Ca_3Sc_2Si_3O_{12}$: $Ce^{3+}$,$Mn^{2+}$ phosphor material according to the present invention combined with red phosphor on an LED package at CCTs of 3000K and 6500K and under 450 nm excitation. This figure shows, as expected, that there is some difference between the spectra at the two different color temperature levels.

Figure 8:
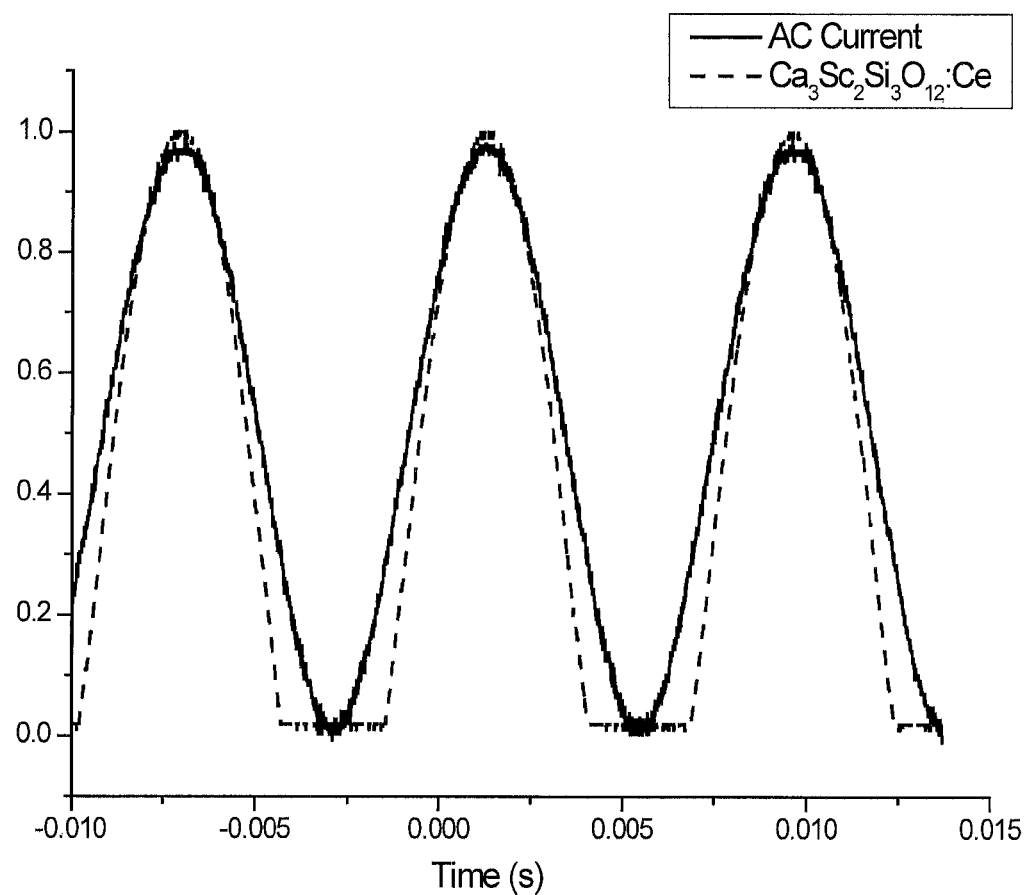
FIG. 8 shows the photoluminescence intensity curve of a $Ca_3Sc_2Si_3O_{12}$:$Ce^{3+}$ phosphor under a 450 nm, 120 Hz sinusoidal excitation.

As noted above, the exemplary long-decay material according to embodiments of the present invention is formed by doping a conventional (short photoluminescence decay time) phosphor material with a suitable dopant. In the examples described above, $Mn^{2+}$ is used as the dopant in what would otherwise be a short photoluminescence decay time material in the photoluminescent materials according to the present invention luminous energy is efficiently transferred from one component of the phosphor material (e.g., $Ce^{3+}$) to the $Mn^{2+}$ ions, as in the exemplary $Ca_3Sc_2Si_3O_{12}$:$Ce^{3+}$,$Mn^{2+}$ phosphor compound. This produces the long-decay characteristics as shown in the earlier figures (e.g., FIGS. 2-6). In contrast, the version of the phosphor material that is not doped with $Mn^{2+}$ has a decay curve that does not show this type of slow decay, e.g., as shown in FIG. 8 which illustrates the photoluminescence intensity curve with very short decay time of $Ca_3Sc_2Si_3O_{12}$:$Ce^{3+}$ phosphor material under 450 nm, 120 Hz AC sinusoidal excitation.

Any suitable approach can be taken to synthesize the long-decay phosphor of the present disclosure. For example, solid state reaction and liquid mixing methods may be employed to synthesize the long decay phosphor materials. Such liquid mixing methods include, for example, methods such as co-precipitation and sol-gel techniques.

According to one embodiment of the present invention, preparation of the long decay phosphor material involves a solid reaction comprising the following steps:
 (1) The starting materials are $Ca(CO_3)_2$, $Sr(CO_3)_2$, $Sc_2O_3$, $SiO_2$, $CeO_2$, $MnCO_3$, MgO, $Al_2O_3$ and $BaF_2$.
 (2) 0.073 gram $Sr(CO_3)_2$, 2.692 gram $Ca(CO_3)_2$, 1.310 gram $Sc_2O_3$, 1.766 gram $SiO_2$, 0.0103 gram $CeO_2$, 0.230 gram $MnCO_3$, 0.0403 gram MgO, 0.0305 gram $Al_2O_3$ and 0.12 gram $BaF_2$ are mixed thoroughly in an agate crucible.
 (3) The above mixtures are then moved to a crucible and sintered at 1300-1600 degrees C. for 3 to 6 hours, then cooled down to room temperature.
 (4) Then the above sample is crushed and sieved using a 32 μm screen.

Figure 9:
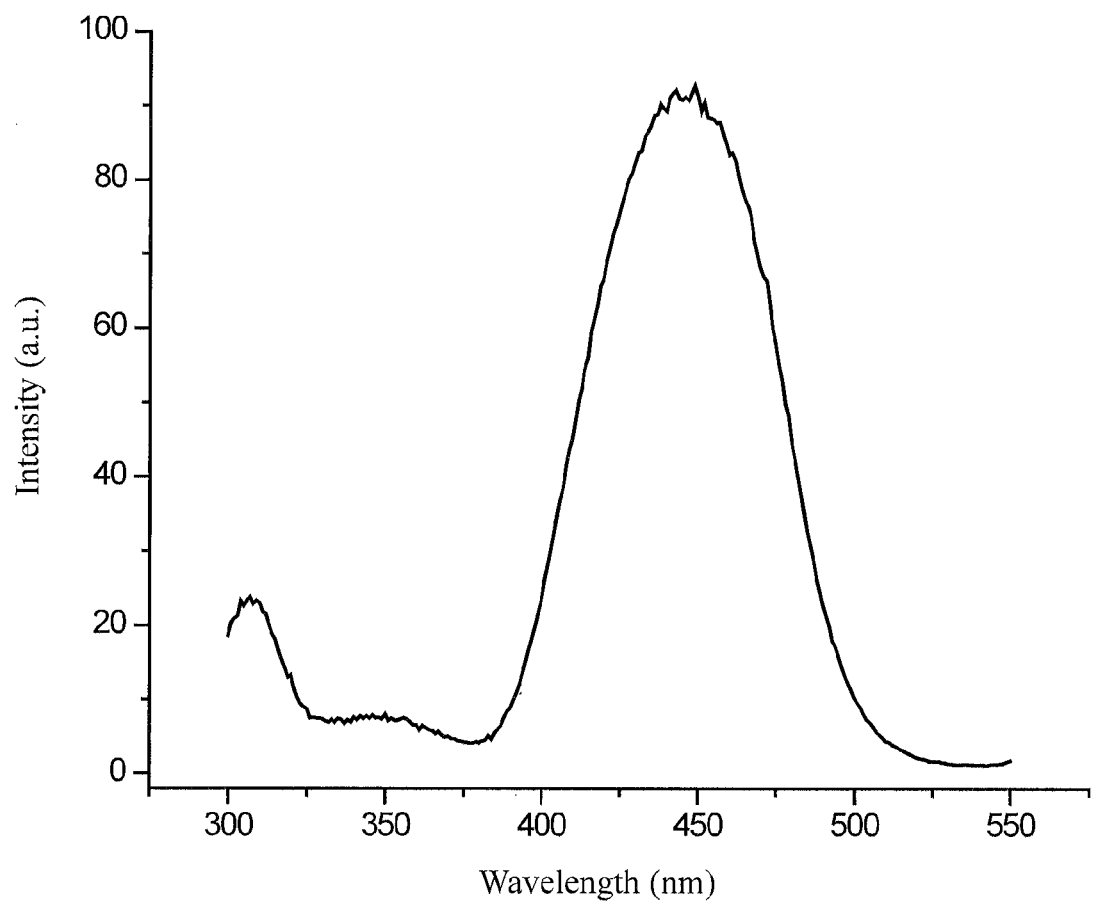
FIG. 9 shows the excitation spectrum of an exemplary $Ca_3Sc_2Si_3O_{12}$:$Ce^{3+}Mn^{2+}$ phosphor of the present invention.

FIG. 9 shows the excitation spectrum of an exemplary $Ca_3Sc_2Si_3O_{12}$:$Ce^{3+}$,$Mn^{2+}$ phosphor material. The spectrum is a broad band from 375 nm to 525 nm which shows that the material has a wide absorption in this region and is suitable for both UV and blue LED excited applications.

Figure 10:
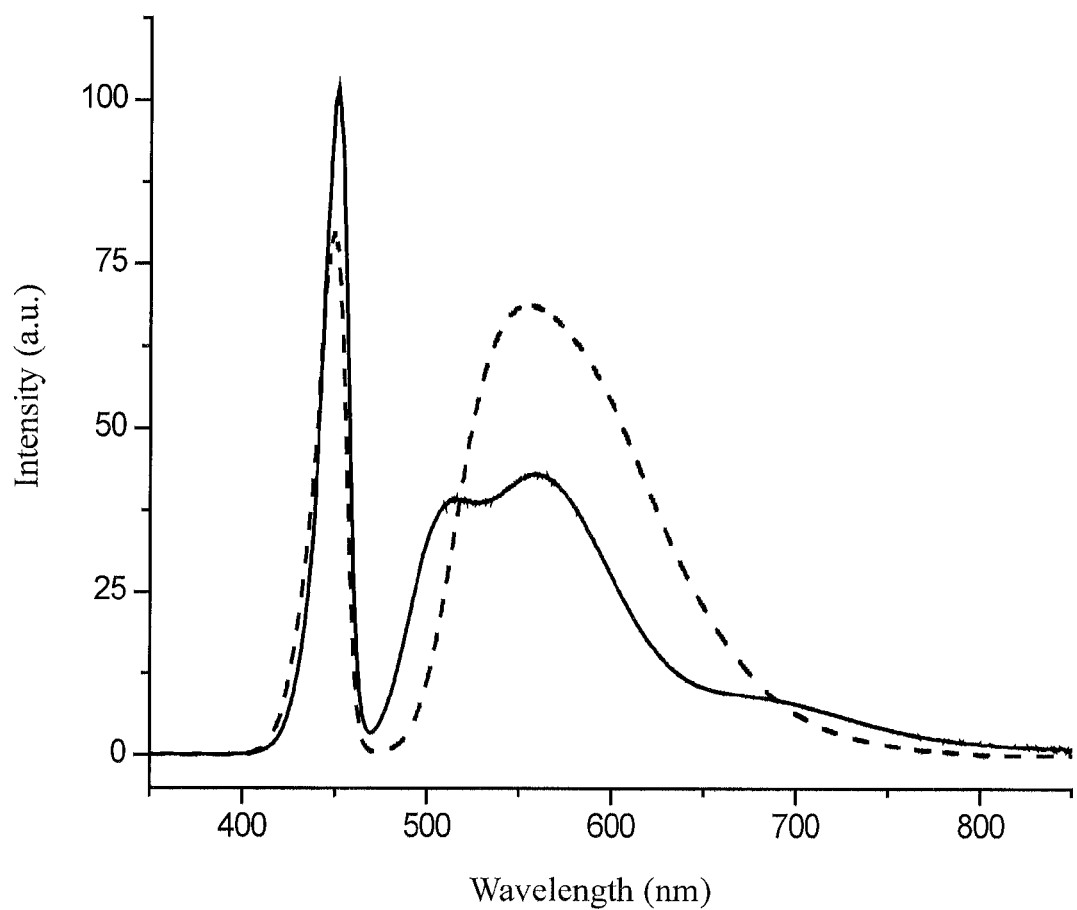
FIG. 10 shows the emission spectra of an exemplary $Ca_3Sc_2Si_3O_{12}$:$Ce^{3+}$, $Mn^{2+}$ phosphor of the present invention (solid line) under 450 nm blue LED excitation, the emission spectrum of $Y_3Al_5O_{12}$:Ce (dashed line) is provided for comparison.

FIG. 10 illustrates the emission spectra of the long-decay $Ca_3Sc_2Si_3O_{12}$:$Ce^{3+}$,$Mn^{2+}$ material under 450 nm blue LED excitation as compared with the conventional $Y_3Al_5O_{12}$:Ce material. The emission spectrum of the $Ca_3Sc_2Si_3O_{12}$:$Ce^{3+}$, $Mn^{2+}$ material is represented by the solid line and the emission spectrum of the $Y_3Al_5O_{12}$:Ce material is represented by the dashed line. As can be seen, the emission peak is at around 560 nm with a shoulder at around 510 nm. The shoulder at around 510 nm is assigned to the emission of $Ce^{3+}$ in the host material while the peak at around 560 nm is assigned to the emission of $Mn^{2+}$ ions in the host material. The CIE of the emission under UV and blue LED excitation varies with the Mn content.

Figure 11:
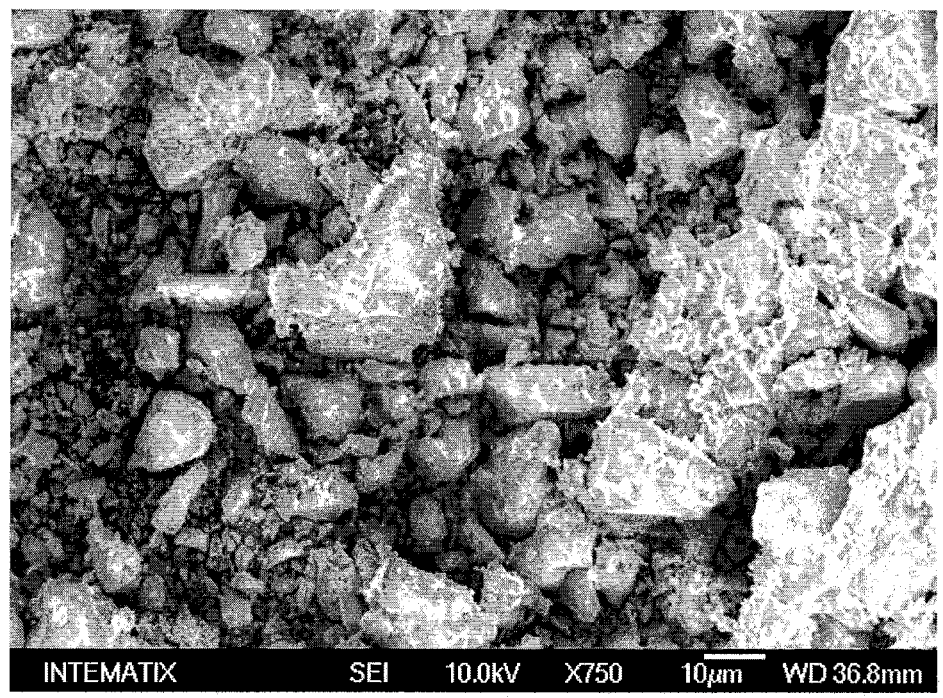
FIG. 11 shows an SEM image of a $Ca_3Sc_2Si_3O_{12}$:$Ce^{3+}$, $Mn^{2+}$ phosphor of the present invention at ×750 magnification.

FIG. 11 shows a scanning electron microscope (SEM) image of the $Ca_3Sc_2Si_3O_{12}$:$Ce^{3+}$,$Mn^{2+}$ material at ×750 magnification. The micrograph shows that the material is crystallized to particles with a wide size distribution from less than 1 micrometer up to more than 40 micrometers in diameter, which is usable for many LED applications.

Figure 12:
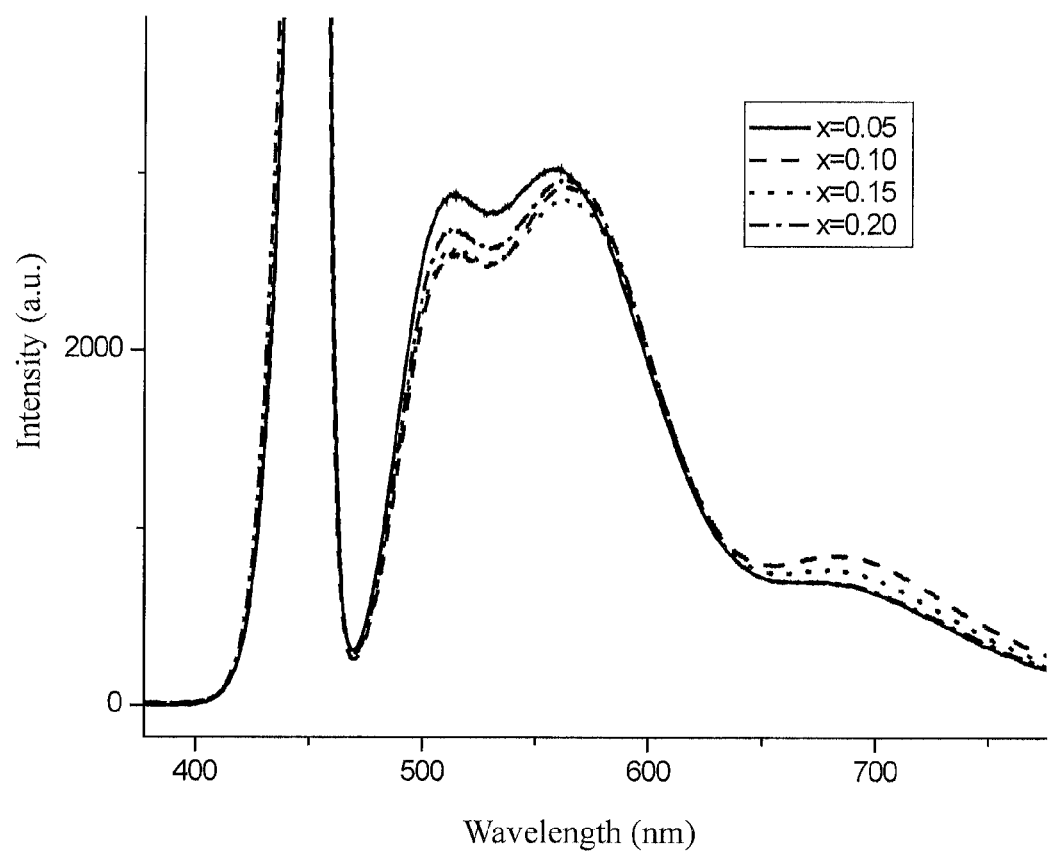
FIG. 12 shows the emission spectra of a series of exemplary $Ca_{3-x}Sr_xSc_2Si_3O_{12}$:$Ce^{3+}$, $Mn^{2+}$ phosphors of the present invention under 450 nm blue LED excitation, where x=0.05, 0.10, 0.15 and 0.20.

In some embodiments, the phosphor material can be modified with the partial substitution of Sr for Ca. This permits tuning of the CIE and brightness for a specific lighting device. FIG. 12 shows the emission spectra of a series of exemplary $Ca_{3-x}Sr_xSc_2Si_3O_{12}$:$Ce^{3+}$,$Mn^{2+}$ phosphor materials according to some embodiments of the present invention under 450 nm blue LED excitation, where the different plots show x varied over the range 0.05 to 0.20, specifically x=0.05, 0.10, 0.15, and 0.20. The emission peak is at around 560 nm with a shoulder at around 510 nm. This shows that both of the peaks—at 510 nm and 560 nm—change in intensity while varying Sr content. The peak at around 510 nm is assigned to the emission of $Ce^{3+}$ in the host material while the peak at around 560 nm is assigned to the emission of $Mn^{2+}$ ions in the host material. The CIE of the emission under UV and blue LED excitation is changeable by varying the amount of Sr substituted for Ca.

Figure 13:
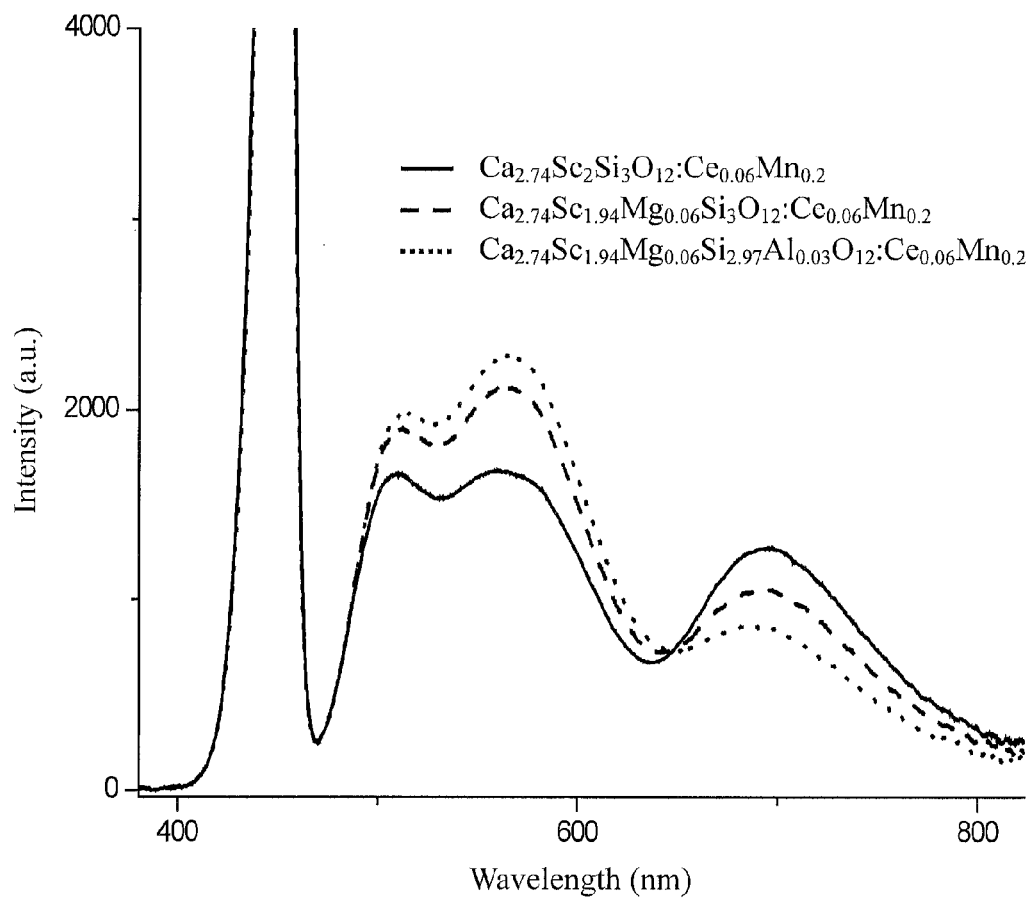
FIG. 13 shows the emission spectra of a series of exemplary $Ca_{2.74}Sc_{2-x}Mg_xSi_{3-y}Al_yO_{12}$:$0.06Ce^{3+}$, $0.2Mn^{2+}$ phosphors of the present invention under 450 nm blue LED excitation, where (1) x=0, y=0; (2) x=0.06, y=0; and (3) x=0.06, y=0.03.

Partial substitutions for the Sc and Si may also be made, with Mg and Al, respectively, for example. FIG. 13 shows the emission spectra of a series of $Ca_{2.74}Sc_{2-x}Mg_xSi_{3-y}Al_yO_{12}$: $0.06Ce^{3+}$, $0.2Mn^{2+}$ phosphor materials under 450 nm blue LED excitation, where (1) x=0, y=0; (2) x=0.06, y=0; and (3) x=0.06, y=0.03. The emission peak is at around 560 nm with shoulders at around 510 nm and 690 nm. This shows that with Mg and Al doping, the peak intensity at 510 nm decreased while the peak intensity at 560 nm and 690 nm increased. The peak at around 510 nm is assigned to the emission of $Ce^{3+}$ in the host material while the peaks at around 560 nm and 690 nm are assigned to the emission of $Mn^{2+}$ ions in the host material. The CIE of the emission under UV and blue LED excitation is changeable by varying the amount of Mg and Al substituted for Sc and Si, respectively.

Figure 14:
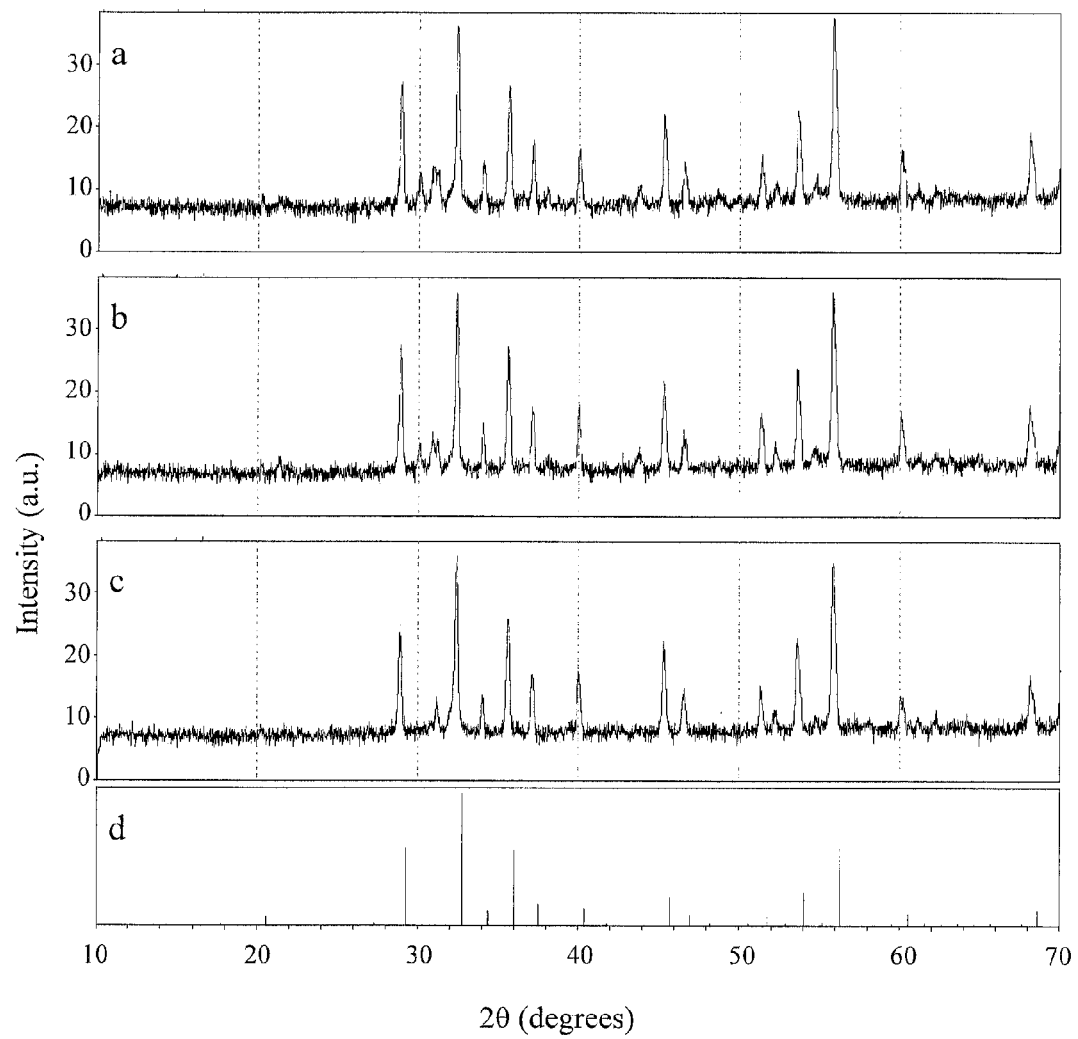
FIG. 14 shows the X-ray diffraction patterns (XRD) of exemplary $Ca_{2.74}Ce^{3+}{}_{0.06}Mn^{2+}{}_{0.2}Sc_{2-x}Mg_xSi_{3-y}Al_yO_{12}$ phosphors of the present invention, where: (a) x=0, y=0; (b) x=0.06, y=0; and (c) x=0.06, y=0.03; and for comparison the standard diffraction pattern for calcium scandium silicate $Ca_3Sc_2Si_3O_{12}$ (JCPDS 74-1578) is provided in (d)

FIG. 14 shows the X-ray diffraction patterns (XRD) of $Ca_{2.74}Ce^{3+}_{0.06}Mn^{2+}_{0.2}Sc_{2-x}Mg_xSi_{3-y}Al_yO_{12}$ phosphor materials according to some embodiments of the present invention, where: (a) x=0, y=0; (b) x=0.06, y=0; and (c) x=0.06, y=0.03; and for comparison the standard diffraction pattern for calcium scandium silicate $Ca_3Sc_2Si_3O_{12}$ (JCPDS 74-1578) is provided in (d). (Here JCPDS stands for the Joint Committee on Powder Diffraction Standards which publishes a library of standard powder diffraction patterns.) The latter spectrum represents the crystal structure of the phosphor compounds. Note that the units for the numbers on the ordinate are actual counts per second. Solid state reaction, liquid co-precipitation methods including calcination and sintering crystallization steps produce substantially crystalline materials. FIG. 14 shows that the three variations of phosphor material are crystallized, although an impurity phase is observed. (The peaks with 2 theta values of roughly 30.5, 31.2 and 52.2 are due to unreacted $ScO_2$.)

Figure 15:
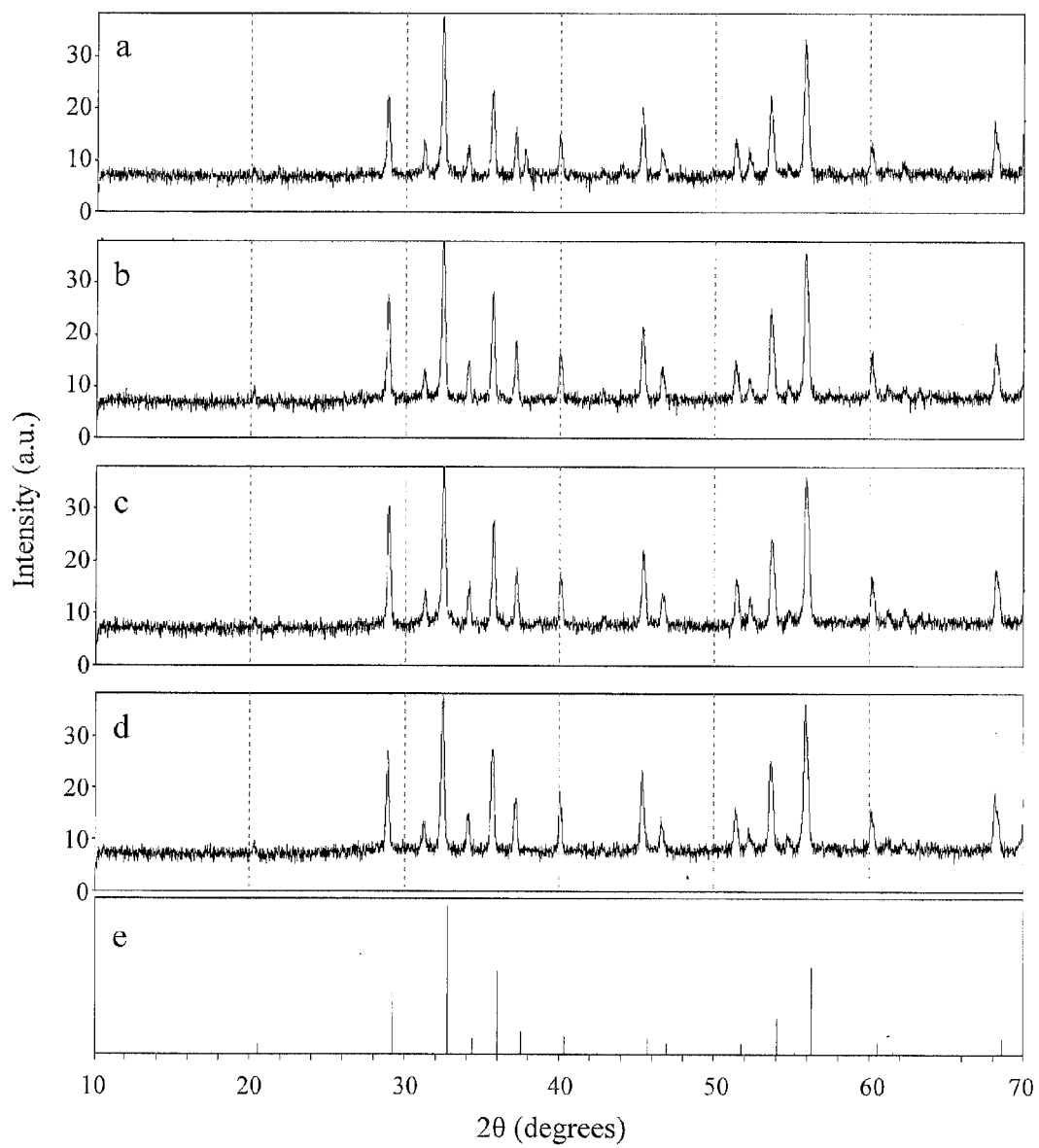
FIG. 15 shows the X-ray diffraction patterns (XRD) of exemplary phosphors $Ca_{2.69}Sr_{0.05}Sc_{2-x}Mg_xSi_{3-y}Al_yO_{12}:Ce^{3+}_{0.06}Mn^{2+}_{0.2}$: of the present invention, where (a) x=0.05, y=0.06, (b) x=0.1, y=0.06, (c) x=0.15, y=0.06, and (d) x=0.2, y=0.06, and for comparison the standard diffraction pattern for calcium scandium silicate $Ca_3Sc_2Si_3O_{12}$ (JCPDS 74-1578) is provided in (e)

FIG. 15 shows the X-ray diffraction patterns (XRD) of $Ca_{2.69}Sr_{0.05}Sc_{2-x}Mg_xSi_{3-y}Al_yO_{12}:Ce^{3+}_{0.06}Mn^{2+}_{0.2}$ material, where x is varied over the range 0.05 to 0.20, specifically (a) x=0.05, y=0.06, (b)×0.1, y=0.06, (c) x=0.15, y=0.06, and (d) x=0.2, y=0.06, and for comparison the standard diffraction pattern for calcium scandium silicate $Ca_3Sc_2Si_3O_{12}$ (JCPDS 74-1578) is provided in (e). The latter spectrum represents the crystal structure of the phosphor compounds. Note that the units for the numbers on the ordinate are actual counts per second. The dopants in this compound will generally occupy the sites in the crystal structure as indicated: Ce occupies Ca site, Mn occupies Ca site, Mg occupies Sc site, and Al occupies Si site. Solid state reaction, liquid co-precipitation methods including calcination and sintering crystallization steps produce substantially crystalline materials. FIG. 15 shows that the four variations of phosphor material are crystallized, although an impurity phase is observed. (The peaks with 2 theta values of roughly 30.5, 31.2 and 52.2 are due to unreacted $ScO_2$.)

Figure 16:
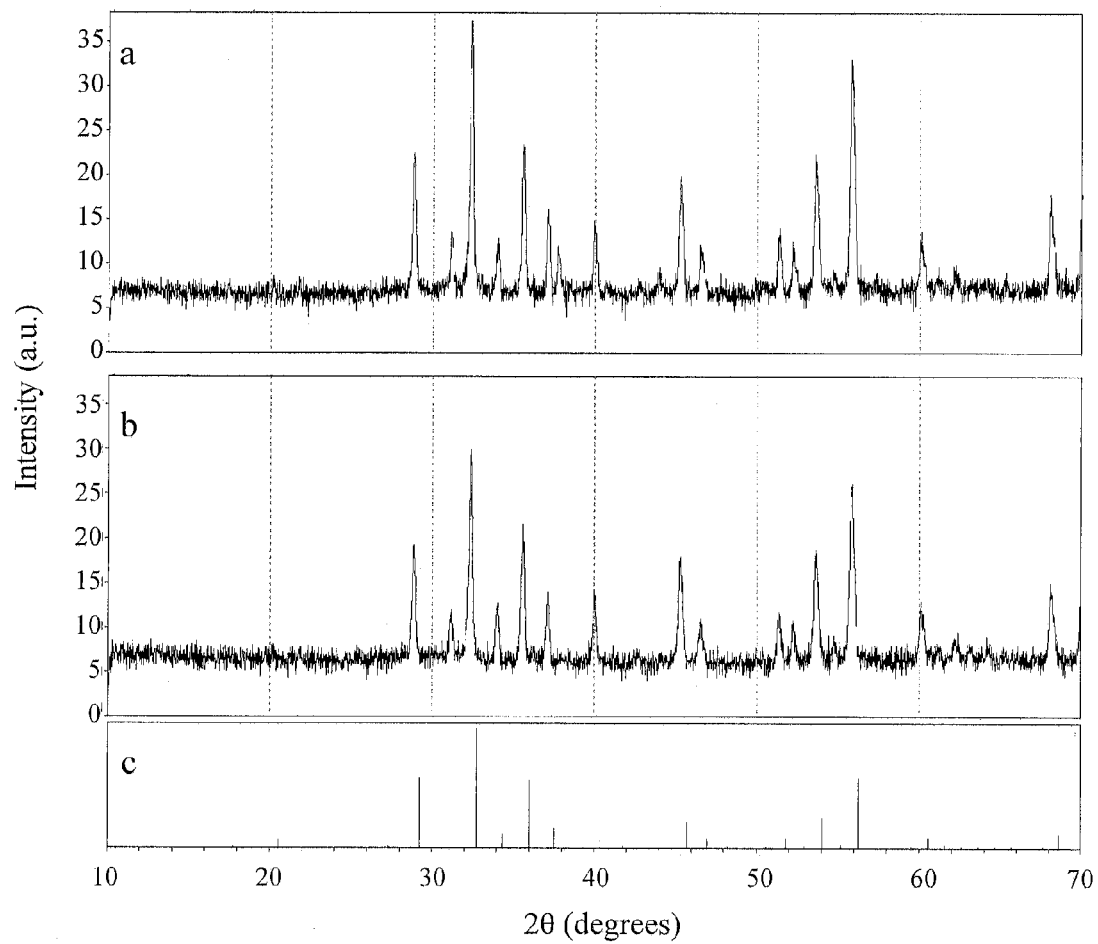
FIG. 16 shows the X-ray diffraction patterns (XRD) of exemplary phosphors $Ca_{2.69}M_{0.05}Ce^{3+}_{0.06}Mn^{2+}_{0.2}ScSi_3O_{12}$. of the present invention, where (a) M=Sr, and (b) M=Ba, and for comparison the standard diffraction pattern for calcium scandium silicate $Ca_3Sc_2Si_3O_{12}$ (JCPDS 74-1578) is provided in (c)

FIG. 16 shows the X-ray diffraction patterns (XRD) of $Ca_{2.69}M_{0.05}Ce^{3+}_{0.06}Mn^{2+}_{0.2}$ where (a) M=Sr, and (b) M=Ba, and for comparison the standard diffraction pattern for calcium scandium silicate $Ca_3Sc_2Si_3O_{12}$ (JCPDS 74-1578) is provided in (c). The latter represents the crystal structure of the phosphor materials. Note that the units for the numbers on the ordinate are actual counts per second. Solid state reaction, liquid co-precipitation methods including calcination and sintering crystallization steps produce substantially crystalline materials. FIG. 16 shows that the two variations of phosphor material are crystallized, although an impurity phase is observed. (The peaks with 2 theta values of roughly 30.5, 31.2 and 52.2 are due to unreacted $ScO_2$.)

Figure 17:
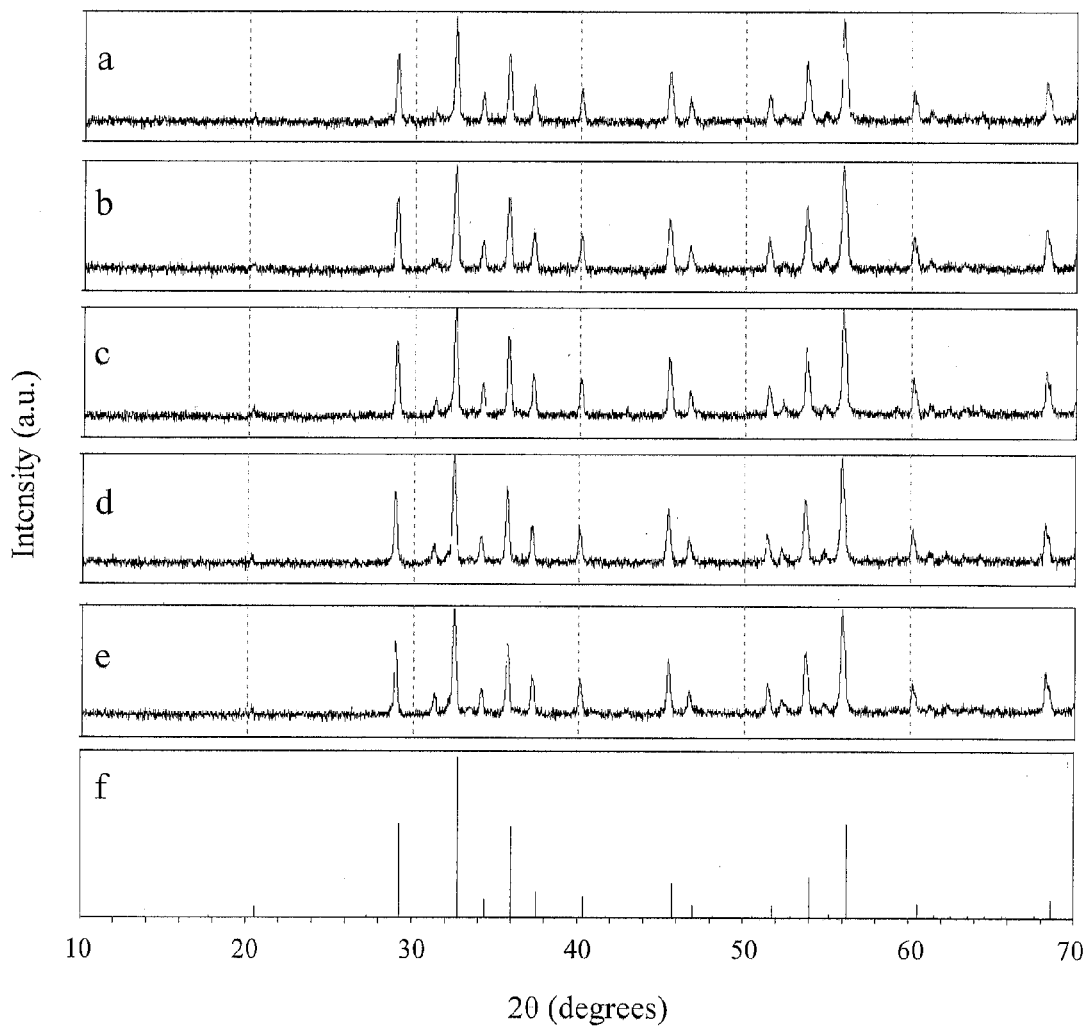
FIG. 17 shows the X-ray diffraction patterns (XRD) of exemplary phosphors $Ca_3Sc_2Si_3O_{12}:Ce^{3+}Mn^{2+}$ of the present invention, where the firing temperature is (a) 1350° C., (b) 1400° C., (c) 1450° C., (d) 1500° C., and (e) 1550° C., and for comparison the standard diffraction pattern for calcium scandium silicate $Ca_3Sc_2Si_3O_{12}$ (JCPDS 74-1578) is provided in (f)

FIG. 17 shows the X-ray diffraction patterns (XRD) of exemplary $Ca_3Sc_2Si_3O_{12}:Ce^{3+}Mn^{2+}$, where the firing temperature is varied over the range 1350° C. to 1550° C., specifically (a) 1350° C., (b) 1400° C., (c) 1450° C., (d) 1500° C., and (e) 1550° C., and for comparison the standard diffraction pattern for calcium scandium silicate $Ca_3Sc_2Si_3O_{12}$ (JCPDS 74-1578) is provided in (f). The latter spectrum represents the crystal structure of the exemplary compound. Solid state reaction, liquid co-precipitation methods including calcination and sintering crystallization steps produce substantially crystalline materials. FIG. 17 shows that the phosphor materials sintered at different temperatures are all crystallized, although an impurity phase is observed. (The peaks with 2 theta values of roughly 30.5, 31.2 and 52.2 are due to unreacted $ScO_2$.)

Figure 18:
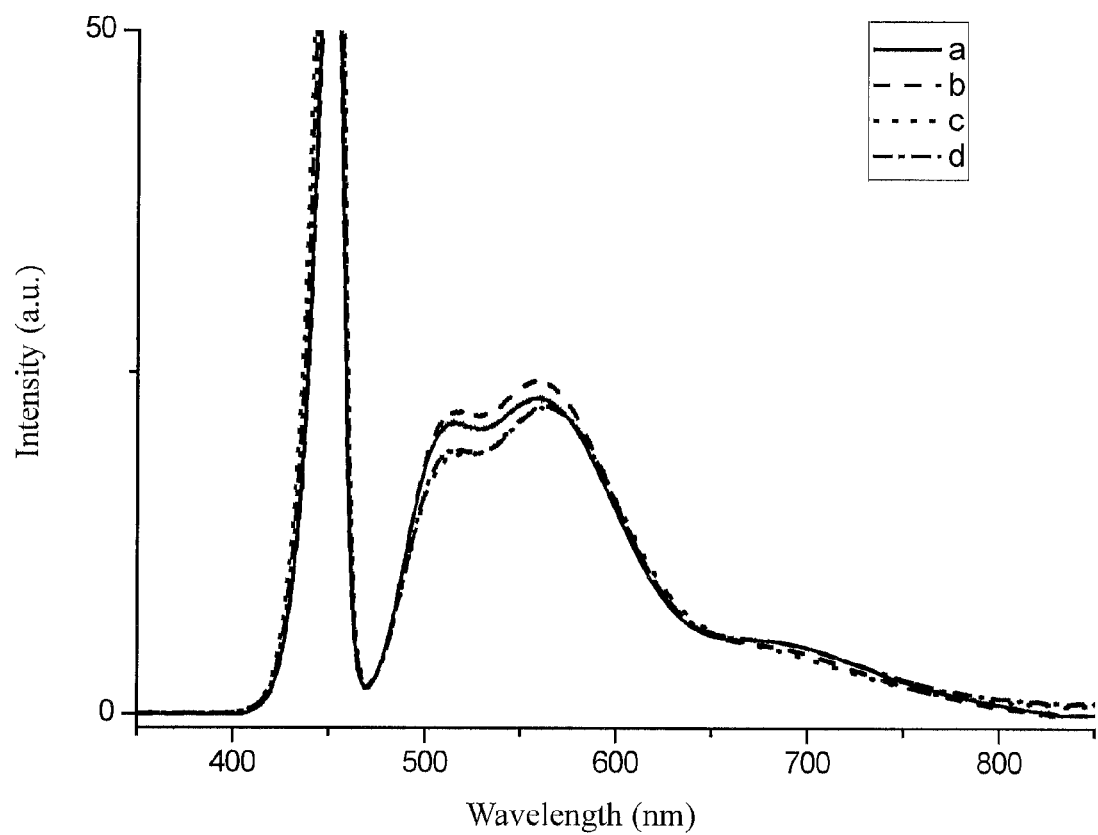
FIG. 18 shows the emission spectra of a series of exemplary phosphors $Ca_{2.74}Sc_{2-x}Mg_xSi_{2.94}Al_{0.06}O_{12}:0.06Ce^{3+}, 0.2Mn^{2+}$ of the present invention, under 450 nm blue LED excitation, where (a) x=0.06, (b) x=0.10, (c) x=0.15, and (d) x=0.25.

FIG. 18 shows the emission spectra of a series of $Ca_{2.74}Sc_{2-x}Mg_xSi_{2.94}Al_{0.06}O_{12}:0.06Ce^{3+},0.2Mn^{2+}$ phosphor materials under 450 nm blue LED excitation, with different concentrations of the Mg dopant, where (a) x=0.06, (b) x=0.10, (c) x=0.15, and (d) x=0.25. The emission peak is at around 560 nm with shoulders at around 510 nm and 690 nm. This shows that with Mg content change, the peak intensities at 510 nm, 560 nm and 690 nm all change. The peak at around 510 nm is assigned to the emission of $Ce^{3+}$ in the host material while the peaks at around 560 nm and 690 nm are assigned to the emission of $Mn^{2+}$ ions in the host material. The CIE of the emission under UV and blue LED excitation is changeable by varying the amount of Mg substituted for Sc.

Figure 19:
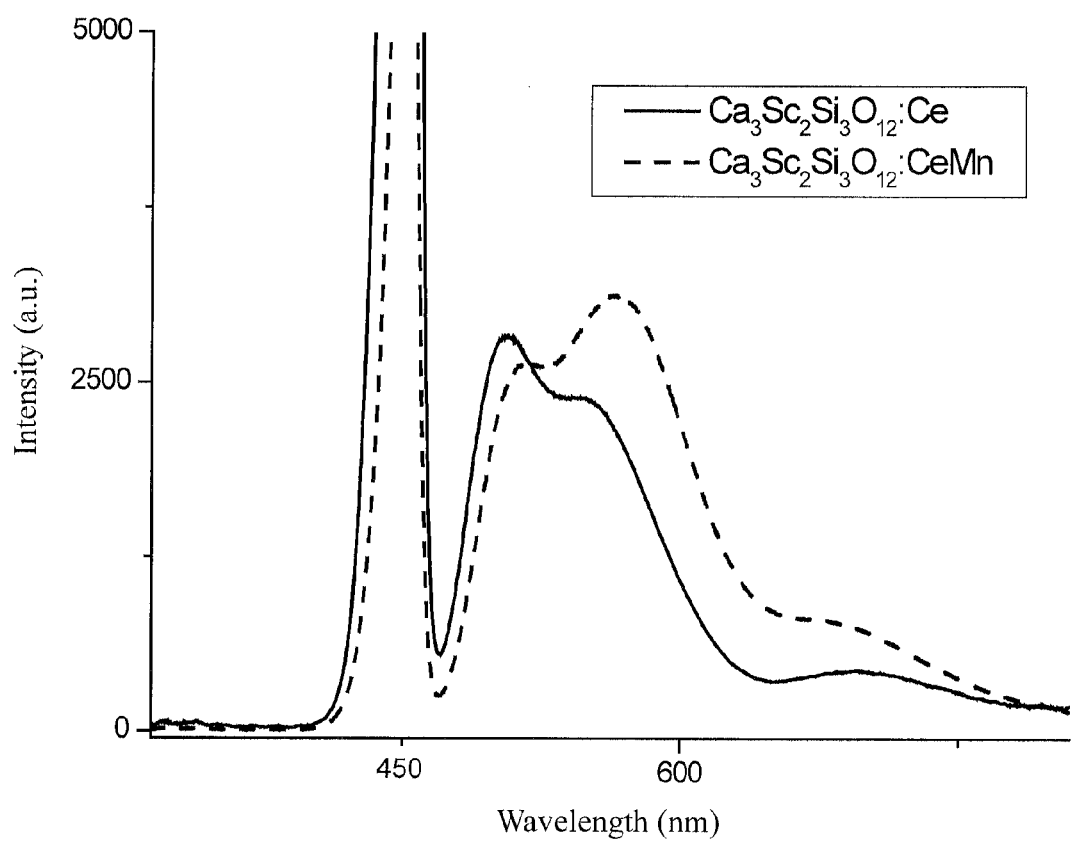
FIG. 19 is the emission spectrum under 450 nm blue LED excitation of the exemplary phosphor $Ca_3Sc_2Si_3O_{12}$ doped by (1) $Ce^{3+}$ and (2) $Ce^{3+},Mn^{2+}$.
Figure 20:
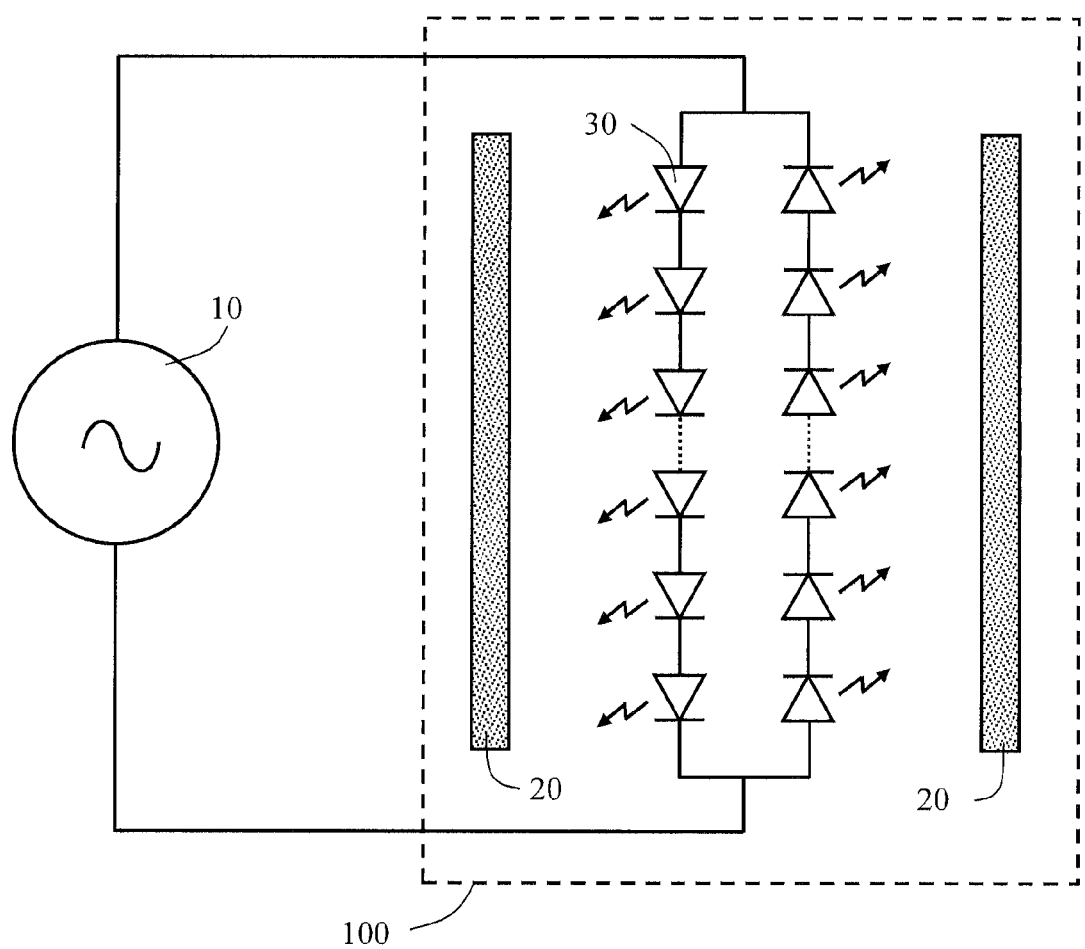
FIG. 20 shows a schematic of a solid state light emitting device, according to some embodiments of the present invention.

FIG. 19 shows the emission spectra under 450 nm blue LED excitation of the phosphor material $Ca_3Sc_2Si_3O_{12}$ doped by (1) $Ce^{3+}$ and (2) $Ce^{3+}$—$Mn^{2+}$. The emission spectrum of the $Ca_3Sc_2Si_3O_{12}:Ce^{3+},Mn^{2+}$ material is represented by the dashed line and the emission spectrum of the $Ca_3Sc_2Si_3O_{12}$:Ce material is represented by the solid line. As can be seen, the emission peak for $Ca_3Sc_2Si_3O_{12}:Ce^{3+},Mn^{2+}$ is at around 560 nm with a shoulder at around 510 nm. The shoulder at around 510 nm is assigned to the emission of $Ce^{3+}$ in the host material while the peak at around 560 nm is assigned to the emission of $Mn^{2+}$ ions in the host material.

Therefore, what has been described is an improved photoluminescent material which has the characteristic of a long photoluminescence time decay. In some embodiments the long decay phosphor is based on a cerium doped calcium scandium silicate phosphor of general composition $Ca_3Sc_2Si_3O_{12}$:Ce that is co-doped with $Mn^{2+}$ to increase the phosphor decay time. An example of such a long decay phosphor material comprises $Ca_{3-x-m-n}A_xSc_{2-y}M_ySi_{3-z}E_zO_{12}$: $mCe^{3+},nMn^{2+}$, where A is at least one divalent cation including Sr, Ba or a combination of monovalent and trivalent cations including combinations of Li, Na, K, B, Al and Ga; M is at least one trivalent cation including Al, Ga, or a divalent cation including Mg; E is a combination of a trivalent and a pentavalent cation including B, Al, Ga, N and P, or a combination of monovalent and trivalent cations including Li, Na, K, B, Al, Ga, N and P, and wherein x+m+n≤3, y<2 and z<3. The formula is written to indicate that the cation A replaces Ca, the cation M replaces Sc, and E replaces Si. This Mn and Ce doped phosphor emits in the yellow part of the spectrum with a peak in emission at around 510 and/or 560 and 690 nm. These phosphors have photoluminescence decay times in milliseconds and enable low cost, long lifetime AC LED illumination systems.

The inventive phosphor material shows efficient emission under both UV and blue LED excitation light. The luminous energy from $Ce^{3+}$ can be efficiently transferred to $Mn^{2+}$ ions in the exemplary material, where the $Mn^{2+}$ dopant is the long decay luminous ion and the material shows efficient luminescence under excitation by UV to blue LEDs. The luminescence of $Mn^{2+}$ ions in some embodiments of the present invention show millisecond decay times, and therefore the emission from $Mn^{2+}$ ions in the material will continue after the AC current is off. This allows the light emission gap between the current OFF and ON to be filled by this long decay light. In addition, the emission of the $Mn^{2+}$ ions in this inventive material show good reliability and high quenching temperature. The phosphor material of the present invention can be used with many types of LED for lighting applications.

One embodiment of the present invention comprises a white light emitting device comprising: one or more LEDs configured to be directly operable from an AC power supply and which generate blue excitation light; and at least one photoluminescent material configured to absorb at least a part of the excitation light and in response emit yellow and/or green light; wherein the decay time of the photoluminescent material is at least one millisecond (the decay time being defined herein as the time taken for the photoluminescence intensity to drop to 50% after excitation stops). Furthermore, the photoluminescent material may have a modulation depth of less than 75% over a single drive cycle for a 50 Hz square wave. Yet furthermore, the white light emitting device may include a photoluminescent material configured such that the decay time of the material reduces flicker in emitted light, particularly from an AC driven blue LED.

A schematic of a white light emitting device according to some embodiments of the present invention is shown in FIG.

20. The white light emitting device 100 is connected to an AC power supply 10. The device 100 includes LEDs 30 and phosphor material 20. The phosphor material 20 includes long decay phosphor material of the present invention and may also include one or more other phosphor materials, such as a conventional red phosphor as described herein. Typically the LEDs are blue LEDs with peak light emission around 450 nm. The LEDs 30 are shown to be configured as two strings of serially connected LEDs, wherein the strings are connected in parallel and in an opposite polarity. However, the LEDs may be configured as a part of a bridge rectifier arrangement. The phosphor material 20 can be provided remotely to the plurality of LEDs such as for example as part of an optical component that is in a spaced relationship to one or more of the LEDs. In some embodiments, the optical component may comprise a substantially planar light transmissive component such as for example a two dimensional sheet or plate. In other embodiments, the component may comprise a solid or hollow three dimensional light transmissive component having convex or concave surfaces such as for example dome-shaped components such as a hemispherical shell or spherical shell or solid shapes including hemispherical and hemispherical shapes. The photoluminescent material can be incorporated within the optical component such that it is substantially homogeneously distributed throughout the volume of the component and/or provided as at least one layer on a surface of the component. Alternatively, the phosphor material can be provided on a light emitting surface of at least one of the plurality of LEDs such as for example within a light transmissive encapsulant on the LED.

Although the present invention has been particularly described with reference to certain embodiments thereof, it should be readily apparent to those of ordinary skill in the art that changes and modifications in the form and details may be made without departing from the spirit and scope of the invention.

What is claimed is:

1. A photoluminescent material of general composition $Ca_{3-x-m-n}A_xSc_{2-y}M_ySi_{3-z}E_zO_{12}:mCe^{3+}, nMn^{2+}$, wherein:
    A is at least one divalent cation including Sr, Ba or a combination of monovalent and trivalent cations including combinations of Li, Na, K, B, Al and Ga;
    M is at least one trivalent cation including Al, Ga, or a divalent cation including Mg;
    E is a combination of a trivalent and a pentavalent cation including B, Al, Ga, N and P, or a combination of monovalent and trivalent cations including Li, Na, K, B, Al, Ga, N and P; and
    $x+m+n<3$, $y<2$ and $z<3$.

2. The photoluminescent material of claim 1, wherein the phosphor is configured to emit yellow-green light in a wavelength ranging from about 510 nm to about 560 nm in response to an excitation source emitting at about 400 nm to about 480 nm.

3. The photoluminescent material of claim 1, wherein the light emitted by the phosphor has a decay time ranging from about 1 ms to about 10 ms, wherein decay time is the time for photoluminescence intensity to fall to 50% after excitation is stopped.

4. The photoluminescent material of claim 1, wherein the composition is selected from the group consisting of:
    $Ca_{2.74}Sc_2Si_3O_{12}Ce_{0.06}Mn_{0.2}$;
    $Ca_{2.74}Sc_{1.94}Mg_{0.06}Si_3O_{12}Ce_{0.06}Mn_{0.2}$;
    $Ca_{2.74}Sc_{1.94}Mg_{0.06}Si_{2.97}Al_{0.03}O_{12}Ce_{0.06}Mn_{0.2}$;
    $Ca_{2.69}Sr_{0.05}Sc_2Si_3O_{12}Ce_{0.06}Mn_{0.2}$;
    $Ca_{2.64}Sr_{0.10}Sc_2Si_3O_{12}Ce_{0.06}Mn_{0.2}$;
    $Ca_{2.59}Sr_{0.15}Sc_2Si_3O_{12}Ce_{0.06}Mn_{0.2}$;
    $Ca_{2.54}Sr_{0.20}Sc_2Si_3O_{12}Ce_{0.06}Mn_{0.2}$;
    $Ca_{2.69}Ba_{0.05}Sc_2Si_3O_{12}Ce_{0.06}Mn_{0.2}$;
    $Ca_{2.74}Sc_{1.94}Mg_{0.06}Si_{2.94}Al_{0.06}O_{12}Ce_{0.06}Mn_{0.2}$;
    $Ca_{2.74}Sc_{1.90}Mg_{0.10}Si_{2.94}Al_{0.06}O_{12}Ce_{0.06}Mn_{0.2}$;
    $Ca_{2.74}Sc_{1.85}Mg_{0.15}Si_{2.94}Al_{0.06}O_{12}Ce_{0.06}Mn_{0.2}$;
    $Ca_{2.74}Sc_{1.75}Mg_{0.25}Si_{2.94}Al_{0.06}O_{12}Ce_{0.06}Mn_{0.2}$;
    $Ca_{2.69}Sr_{0.05}Sc_{1.95}Mg_{0.05}Si_{2.94}Al_{0.06}O_{12}Ce_{0.06}Mn_{0.2}$;
    $Ca_{2.69}Sr_{0.05}Sc_{1.90}Mg_{0.10}Si_{2.94}Al_{0.06}O_{12}Ce_{0.06}Mn_{0.2}$;
    $Ca_{2.69}Sr_{0.05}Sc_{1.85}Mg_{0.15}Si_{2.94}Al_{0.06}O_{12}Ce_{0.06}Mn_{0.2}$; and
    $Ca_{2.69}Sr_{0.05}Sc_{1.80}Mg_{0.20}Si_{2.94}Al_{0.06}O_{12}Ce_{0.06}Mn_{0.2}$.

5. A white light lighting system comprising:
    a plurality of LEDs configured to be directly operable from an AC power supply and which generate blue excitation light; and
    a photoluminescent material configured to absorb at least a part of the excitation light and in response emit yellow and/or green light, said photoluminescent material being a Ce and Mn doped silicate phosphor;
    wherein said photoluminescent material has the general composition of the photoluminescent material of claim 1 and a decay time of at least 1 ms.

6. The lighting system of claim 5, wherein said photoluminescent material has a decay time of at least 3 ms.

7. The lighting system of claim 5, wherein said photoluminescent material is configured such that the decay time of said material reduces flicker in emitted light.

8. The lighting system of claim 5, wherein said plurality of LEDs are configured as at least two strings of serially connected LEDs, wherein the strings are connected in parallel and with an opposite polarity.

9. The lighting system of claim 5, wherein said photoluminescent material is provided remotely to said plurality of LEDs.

10. The lighting system of claim 5, wherein said photoluminescent material is provided on a light emitting surface of at least one of said plurality of LEDs.

11. The lighting system of claim 5, wherein the system is drivable from a sinusoidal or a square wave drive.

12. The lighting system of claim 5, wherein said photoluminescent material has a formula selected from the group consisting of:
    $Ca_{2.74}Sc_2Si_3O_{12}Ce_{0.06}Mn_{0.2}$
    $Ca_{2.74}Sc_{1.94}Mg_{0.06}Si_3O_{12}Ce_{0.06}Mn_{0.2}$;
    $Ca_{2.74}Sc_{1.94}Mg_{0.06}Si_{2.97}Al_{0.03}O_{12}Ce_{0.06}Mn_{0.2}$;
    $Ca_{2.69}Sr_{0.05}Sc_2Si_3O_{12}Ce_{0.06}Mn_{0.2}$;
    $Ca_{2.64}Sr_{0.10}Sc_2Si_3O_{12}Ce_{0.06}Mn_{0.2}$;
    $Ca_{2.59}Sr_{0.15}Sc_2Si_3O_{12}Ce_{0.06}Mn_{0.2}$;
    $Ca_{2.54}Sr_{0.20}Sc_2Si_3O_{12}Ce_{0.06}Mn_{0.2}$;
    $Ca_{2.69}Ba_{0.05}Sc_2Si_3O_{12}Ce_{0.06}Mn_{0.2}$;
    $Ca_{2.74}Sc_{1.94}Mg_{0.06}Si_{2.94}Al_{0.06}O_{12}Ce_{0.06}Mn_{0.2}$;
    $Ca_{2.74}Sc_{1.90}Mg_{0.10}Si_{2.94}Al_{0.06}O_{12}Ce_{0.06}Mn_{0.2}$;
    $Ca_{2.74}Sc_{1.85}Mg_{0.15}Si_{2.94}Al_{0.06}O_{12}Ce_{0.06}Mn_{0.2}$;
    $Ca_{2.74}Sc_{1.75}Mg_{0.25}Si_{2.94}Al_{0.06}O_{12}Ce_{0.06}Mn_{0.2}$;
    $Ca_{2.69}Sr_{0.05}Sc_{1.95}Mg_{0.05}Si_{2.94}Al_{0.06}O_{12}Ce_{0.06}Mn_{0.2}$;
    $Ca_{2.69}Sr_{0.05}Sc_{1.90}Mg_{0.10}Si_{2.94}Al_{0.06}O_{12}Ce_{0.06}Mn_{0.2}$;
    $Ca_{2.69}Sr_{0.05}Sc_{1.85}Mg_{0.15}Si_{2.94}Al_{0.06}O_{12}Ce_{0.06}Mn_{0.2}$; and
    $Ca_{2.69}Sr_{0.05}Sc_{1.80}Mg_{0.20}Si_{2.94}Al_{0.06}O_{12}Ce_{0.06}Mn_{0.2}$.

13. The lighting system of claim 5, further comprising a red phosphor.

14. A white light lighting system comprising:
    a plurality of LEDs configured to be directly operable from an AC power supply having a drive cycle and which generate blue excitation light; and
    a phosphor including a photoluminescent material configured to absorb at least a part of the excitation light and in response emit yellow and/or green light, said photoluminescent material being a Ce and Mn doped silicate phosphor;

wherein the modulation depth of light emitted by said phosphor over a single drive cycle is less than about 75%, and wherein said photoluminescent material has the general composition of the photoluminescent material of claim 1.

15. The lighting system of claim 14, wherein said phosphor is selected such that the modulation depth of light emitted by said phosphor over a single drive cycle is less than about 50%.

16. The lighting system of claim 14, wherein said phosphor is selected such that the modulation depth of light emitted by said phosphor over a single drive cycle is less than about 25%.

17. The lighting system of claim 14, wherein said phosphor is provided on a light emitting surface of at least one of said plurality of LEDs.

18. The lighting system of claim 14, wherein the system is drivable from a sinusoidal or a square wave drive.

19. The lighting system of claim 14, wherein said photoluminescent material has a formula selected from the group consisting of:

$Ca_{2.74}Sc_2Si_3O_{12}Ce_{0.06}Mn_{0.2}$;
$Ca_{2.74}Sc_{1.94}Mg_{0.06}Si_3O_{12}Ce_{0.06}Mn_{0.2}$;
$Ca_{2.74}Sc_{1.94}Mg_{0.06}Si_{2.97}Al_{0.03}O_{12}Ce_{0.06}Mn_{0.2}$;
$Ca_{2.69}Sr_{0.05}Sc_2Si_3O_{12}Ce_{0.06}Mn_{0.2}$;
$Ca_{2.64}Sr_{0.10}Sc_2Si_3O_{12}Ce_{0.06}Mn_{0.2}$;
$Ca_{2.59}Sr_{0.15}Sc_2Si_3O_{12}Ce_{0.06}Mn_{0.2}$;
$Ca_{2.54}Sr_{0.20}Sc_2Si_3O_{12}Ce_{0.06}Mn_{0.2}$;
$Ca_{2.69}Ba_{0.05}Sc_2Si_3O_{12}Ce_{0.06}Mn_{0.2}$;
$Ca_{2.74}Sc_{1.94}Mg_{0.06}Si_{2.94}Al_{0.06}O_{12}Ce_{0.06}Mn_{0.2}$;
$Ca_{2.74}Sc_{1.90}Mg_{0.10}Si_{2.94}Al_{0.06}O_{12}Ce_{0.06}Mn_{0.2}$;
$Ca_{2.74}Sc_{1.85}Mg_{0.15}Si_{2.94}Al_{0.06}O_{12}Ce_{0.06}Mn_{0.2}$;
$Ca_{2.74}Sc_{1.75}Mg_{0.25}Si_{2.94}Al_{0.06}O_{12}Ce_{0.06}Mn_{0.2}$;
$Ca_{2.69}Sr_{0.05}Sc_{1.95}Mg_{0.05}Si_{2.94}Al_{0.06}O_{12}Ce_{0.06}Mn_{0.2}$;
$Ca_{2.69}Sr_{0.05}Sc_{1.90}Mg_{0.10}Si_{2.94}Al_{0.06}O_{12}Ce_{0.06}Mn_{0.2}$;
$Ca_{2.69}Sr_{0.05}Sc_{1.85}Mg_{0.15}Si_{2.94}Al_{0.06}O_{12}Ce_{0.06}Mn_{0.2}$; and
$Ca_{2.69}Sr_{0.05}Sc_{1.80}Mg_{0.20}Si_{2.94}Al_{0.06}O_{12}Ce_{0.06}Mn_{0.2}$.

20. The lighting system of claim 14, wherein said phosphor further includes a red phosphor.

* * * * *